(12) United States Patent
Pinder

(10) Patent No.: US 12,317,966 B2
(45) Date of Patent: Jun. 3, 2025

(54) SWITCH CLASP

(71) Applicant: Elizabeth Louise Pinder, Los Angeles, CA (US)

(72) Inventor: Elizabeth Louise Pinder, Los Angeles, CA (US)

(*) Notice: Subject to any disclaimer, the term of this patent is extended or adjusted under 35 U.S.C. 154(b) by 88 days.

(21) Appl. No.: 18/058,526

(22) Filed: Nov. 23, 2022

(65) Prior Publication Data

US 2023/0172322 A1 Jun. 8, 2023

Related U.S. Application Data

(60) Provisional application No. 63/285,661, filed on Dec. 3, 2021.

(51) Int. Cl.
| | | |
|---|---|---|
| A44B 19/04 | (2006.01) | |
| A44B 17/00 | (2006.01) | |
| H05K 7/14 | (2006.01) | |

(52) U.S. Cl.
CPC ...... *A44B 17/0064* (2013.01); *A44B 17/0005* (2013.01); *H05K 7/1452* (2013.01); *A44D 2203/00* (2013.01); *A44D 2211/00* (2013.01)

(58) Field of Classification Search
CPC ............... A44B 17/0064; A44B 19/24; A44D 2203/00; A44D 2211/00; H05K 7/1452; H01H 2001/125
See application file for complete search history.

(56) References Cited

U.S. PATENT DOCUMENTS

| | | | | |
|---|---|---|---|---|
| 7,304,600 | B2 * | 12/2007 | Nehls | G08C 17/02 |
| | | | | 340/12.5 |
| 10,192,421 | B2 * | 1/2019 | Tourrette | A44B 1/02 |
| 10,403,450 | B2 * | 9/2019 | Tourrette | H01H 1/12 |
| 10,584,980 | B2 * | 3/2020 | Ballantyne | G01D 5/14 |
| 2004/0174702 | A1 | 9/2004 | Guerrieri | |
| 2007/0008714 | A1 | 1/2007 | Kilfedder | |
| 2021/0100503 | A1 | 4/2021 | Olwal et al. | |

FOREIGN PATENT DOCUMENTS

GB 2427241 A 12/2006

OTHER PUBLICATIONS

International Search Report and Written Opinion of the International Searching Authority regarding International Patent Application No. PCT/GB2022/052971, dated Mar. 6, 2023.

* cited by examiner

*Primary Examiner* — Jack W Lavinder

(74) *Attorney, Agent, or Firm* — Harness, Dickey & Pierce, P.L.C.

(57) ABSTRACT

A switch clasp has a first part and a second part. The second part has a first set of zip teeth and the first part has a complementary set of zip teeth. A sensor is responsive to engagement and disengagement of the first and second parts to switch from a first condition to a second condition and a signal corresponding to the condition is output. The sensor includes a first section of conductive track connected to a first conductive tooth of the set of zip teeth and a second section of conductive track connected to a second conductive tooth of the complementary set of zip teeth. The zip pull connects the first conductive tooth to the second conductive tooth to electrically connect the first section of conductive track to the second section of conductive track when connecting the set of zip teeth to the complementary set of zip teeth.

10 Claims, 23 Drawing Sheets

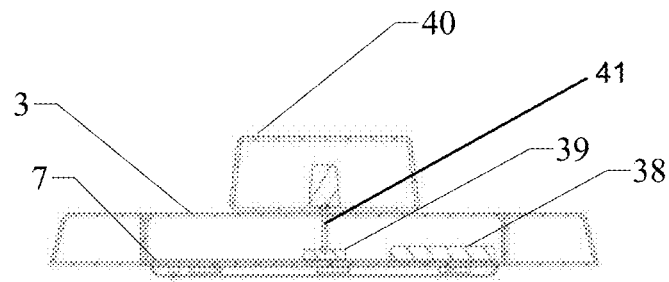
Figure 21
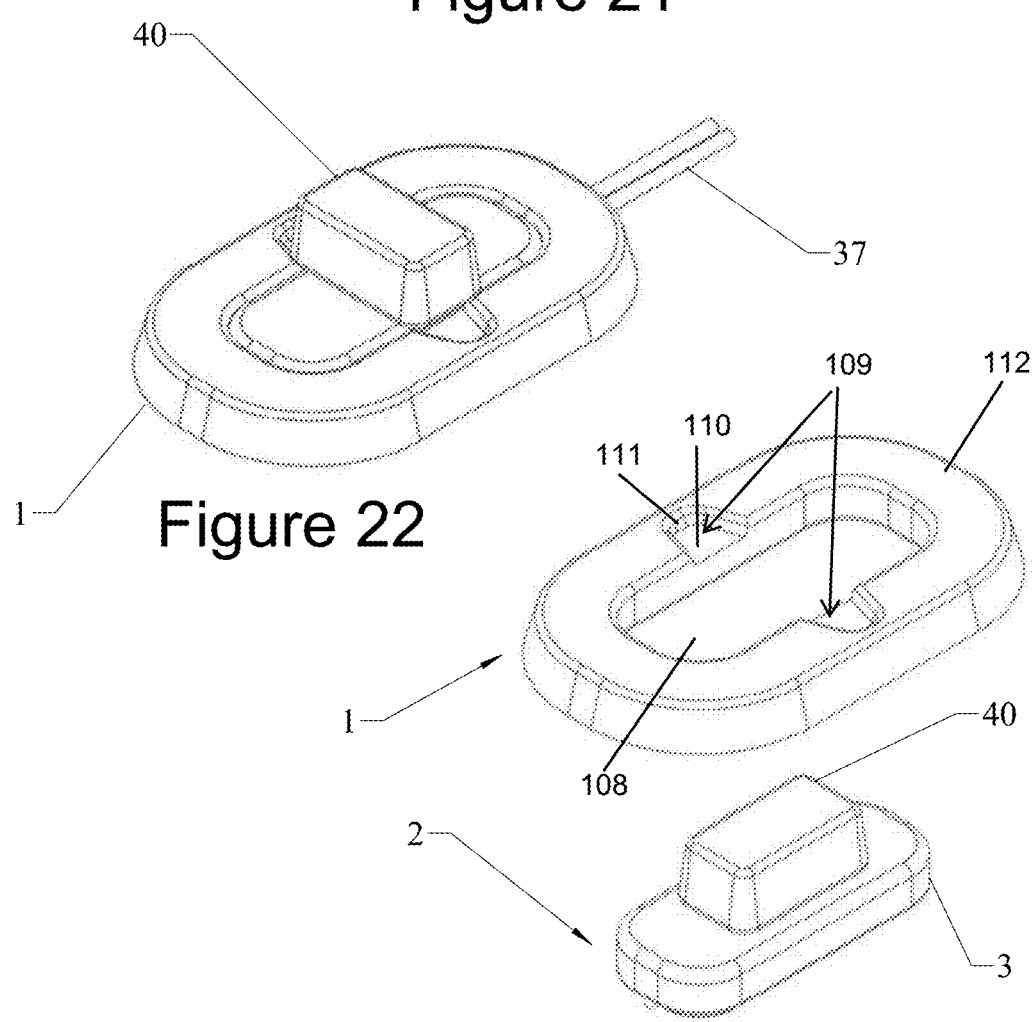
Figure 22
Figure 23

(a)

(b)

(a)

(b)

SWITCH CLASP

CROSS-REFERENCE TO RELATED APPLICATIONS

This application claims the benefit of U.S. Provisional Application No. 63/285,661, filed on Dec. 3, 2021. The entire disclosure of the above application is incorporated herein by reference.

FIELD

The present disclosure relates to a switch clasp that is an electrical switch capable of acting as a clasp or a clasp capable of acting as an electrical switch.

BACKGROUND

This section provides background information related to the present disclosure which is not necessarily prior art.

CN210696397U discloses a magnetic clasp for use in securing a closure flap of a bag such as a satchel. The clasp of CN210696397U comprises a male part and a female assembly. The male part includes a projection incorporating a magnet of a first polarity and a mount to mount the male part onto a membrane such as the closure flap of a bag. The female assembly includes a socket incorporating a magnetic element of the second polarity and a mount to mount the female assembly on the body of a bag. In order to close the flap against the body the flap is manipulated to engage the projection in the socket where it is held by magnetic attraction. Opening the bag is simply achieved by applying sufficient force in a direction to overcome the magnetic attraction. There is no electrical switch described in CN21069639U.

There are many other known types of clasp which comprise male and female parts. For example, there are "latch" and "snap" clasps, in which a male and/or female part resiliently deforms to enable the male part to fit inside the female part, and then "snaps" back to its original shape, or closer to its original shape, so as to fix the male and female parts relative to each other. Another example clasp type is a rotor clasp in which one of the male and/or female parts comprises a "rotor" which is rotatable so as to fix the relative positions of the male and female parts.

Clasps are used to secure two items together. Commonly, clasps are used to secure a closure flap on a bag, such as a handbag, satchel or rucksack. Clasps are also used to secure opposing sides of a bag, or opposing sides on a garment.

SUMMARY

This section provides a general summary of the disclosure, and is not a comprehensive disclosure of its full scope or all of its features.

According to an aspect of the disclosure, there is provided a switch clasp comprising: a first part having a fastening structure adapted to secure the first part to a first item; a second part having a fastening structure adapted to secure the second part to a second item; said second part having an attractor adapted to attract a complementary attractor in the first part when the first and second parts are brought into engagement; at least one of said first part and second part including a sensor responsive to engagement and disengagement of the first and second parts to switch from a first condition to a second condition whereby a signal corresponding to the condition is output.

The term "clasp" used herein is intended to refer to a device with interlocking first and second parts used for fastening things together. Each of FIGS. 1-36 show examples of clasps.

The "first" and "second" parts of the switch clasp may alternatively be referred to as "male" and "female" parts.

The "first" and "second" items may refer to opposing sides of a bag or garment. The "first" and "second" items may refer to a closure flap of a bag or garment and the rest of said bag or garment. The "first" and "second" items may refer to any two items which are to be secured via the clasp.

The fastening structure of the first part may be a staple. The fastening structure of the second part may be a staple.

The fastening structure of the first part may be pair of flanges. The fastening structure of the second part may be a pair of flanges.

The fastening structure of the first part may be a plurality of holes formed in the first part configured to receive thread for stitching the first part to the first item. The fastening structure of the second part may be a plurality of holes formed in the second part configured to receive thread for stitching the second part to the second item.

The attractor may be a permanent magnet and the complementary attractor may be, or comprise, a paramagnetic or ferromagnetic material. The attractor may be a permanent magnet and the complementary attractor may be a permanent magnet.

The attractor may be a pin and the complementary attractor may be a spring clip.

The attractor may be a rotor and the complementary attractor may be a surface against which the rotor is configured to abut. The sensor may be responsive to rotation of the rotor.

The attractor may be a hoop. The complementary attractor may comprise a wedging surface. The complementary attractor may comprise a wedging surface and a lip. The lip of the complementary attractor may be configured to abut the hoop.

The attractor may be a set of zip teeth. The complementary attractor may be a set of complementary zip teeth.

The sensor may be a switch. The sensor may be a push button switch. The sensor may be a lever switch. The switch may be comprised in the first part and may switch from the first condition to the second condition via contact with the second part. The switch may be comprised in the second part and may switch from the first condition to the second condition via contact with the first part.

The sensor may be a magnetic sensor. The sensor may be a reed switch. The sensor may be a hall effect sensor. The sensor may be a magnetic sensor configured to detect the attractor. The sensor may be a magnetic sensor configured to detect a permanent magnet which acts as the attractor. The magnetic sensor may be configured to switch from the first condition to the second condition when the first part brought into close proximity with the second part.

The sensor may be a potentiometer. The sensor may be a rotary switch. The sensor may be connected to a rotor and rotation of the rotor may switch the sensor from the first condition to the second condition.

The sensor may be an electrical contact switch. The sensor may comprise a conductive element moveable to break or complete an electrical circuit. The conductive element may be a zip tooth. The zip tooth may complete the electrical circuit when it is disposed between a pair of neighboring zip teeth in an opposing set of zip teeth. Completing the electrical circuit may switch the sensor from the first condition to the second condition.

The first condition may be an "on" or "off" state of a switch, and the second state may be an opposing "off" or "on" state of a switch.

The switch clasp may comprise one or more output devices. The one or more output devices may comprise one or more of: visual output devices, such as LEDs and bulbs; audio output devices, such as buzzers, speakers, and alarms; or non-sensory outputs, such as silent alarms or locating means.

The switch clasp may comprise electrical connectors connectable to one or more output devices of an external circuit. The sensor may act as a switch to control the one or more output devices of the external circuit.

The first condition of the sensor may correspond to the output devices being active or inactive. The second condition may correspond to the output devices being active or inactive.

Some embodiments of the present disclosure comprise: a switch clasp comprising a first part having a fastening structure adapted to secure the first part to a first item; a second part having a fastening structure adapted to secure the second part to a second item; said first part having a permanent magnetic element polarized to be attracted to a permanent magnet element or ferromagnetic element in the second part when the first and second parts are brought into close proximity; at least one of said first and second parts including a sensor sensitive to output an electrical signal in response to engagement or disengagement of the first and second parts.

The fastening structure for either the first or second part may take the form of a frame or housing having projections forming the limbs of a staple, however, the fastening means may also or alternatively include features such as holes or projections to engage thread so that the parts can be secured by stitches to the item. The fastening means may also or alternatively have features such as holes, which may be threaded to receive screws or machine screws or rivets. The fastening structure may be adapted to be secured by adhesive or welding.

The switch clasp was originally envisioned as a fastening for the closure of a bag having a body and a closure flap of some form so the items to be held together by the clasp would be parts of a single item. However, each item to which the parts are respectively fastened may be wholly separable.

The sensor is preferably located in only one of the first or second parts. This means that electrical connection to a read out for the sensor is required at only one item, minimizing the steps to install the switch clasp and connect it to a read out device responsive to the electrical signal. A preferred form of sensor is a monostable micro switch or magnetic proximity switch i.e., hall or reed switch. In the case of some clasps, a rotational switch can be used arranged to normally open or closed depending on use a circuit in a first condition and close a circuit in a second condition. The read out device will depend on the purpose the switch clasp is intended to serve but may usefully be a light or an alarm. Thus in an application where the switch clasp serves as the clasp for a handbag, opening the clasp may cause a light internal to the body of the bag to switch on to illuminate the contents, alternatively the switch clasp may cause an alarm to sound in the event of unauthorized opening.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 21 shows a cross-sectional side view of a switch clasp comprising a rotor, with the first and second parts engaged;

FIG. 22 shows a perspective view of the switch clasp of FIG. 21 with the first and second parts engaged and the rotor in a closed configuration;

FIG. 23 shows a perspective view of the switch clasp of FIG. 21 with the first and second parts separated and the rotor in an insertion condition;

Figure 24:
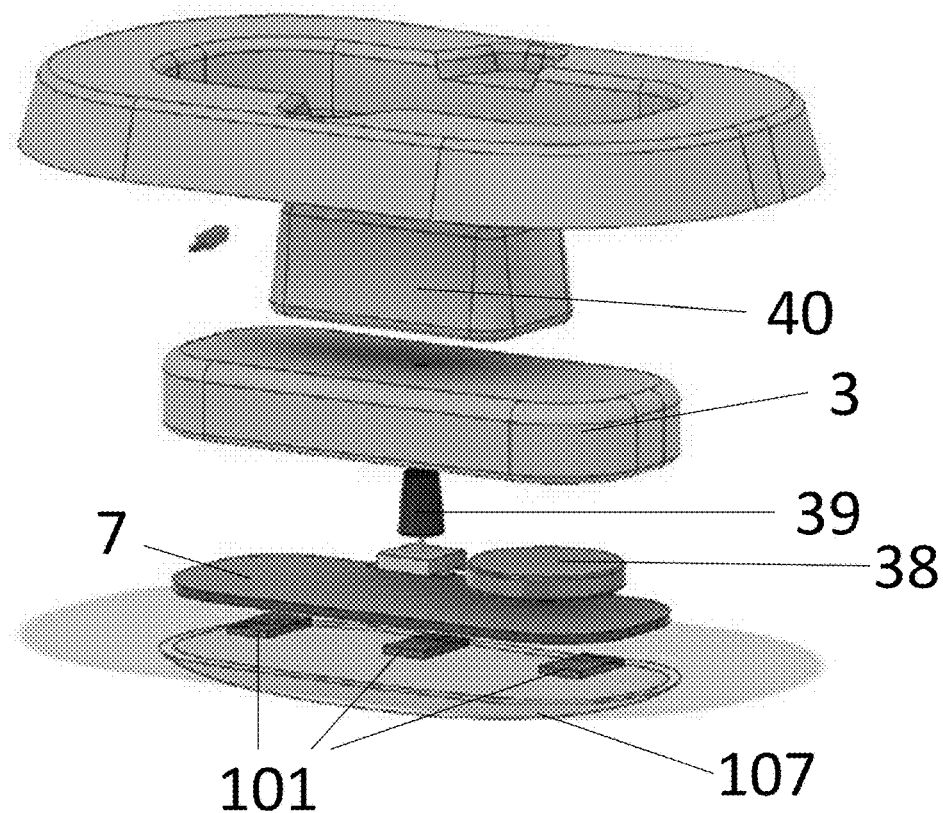
Figure 24:
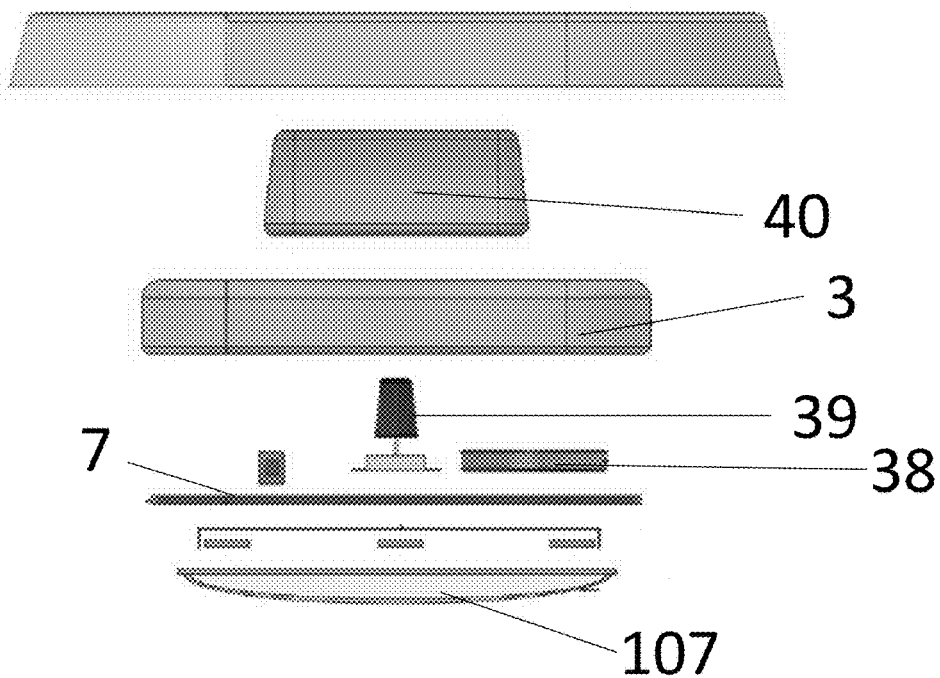
Figure 25:
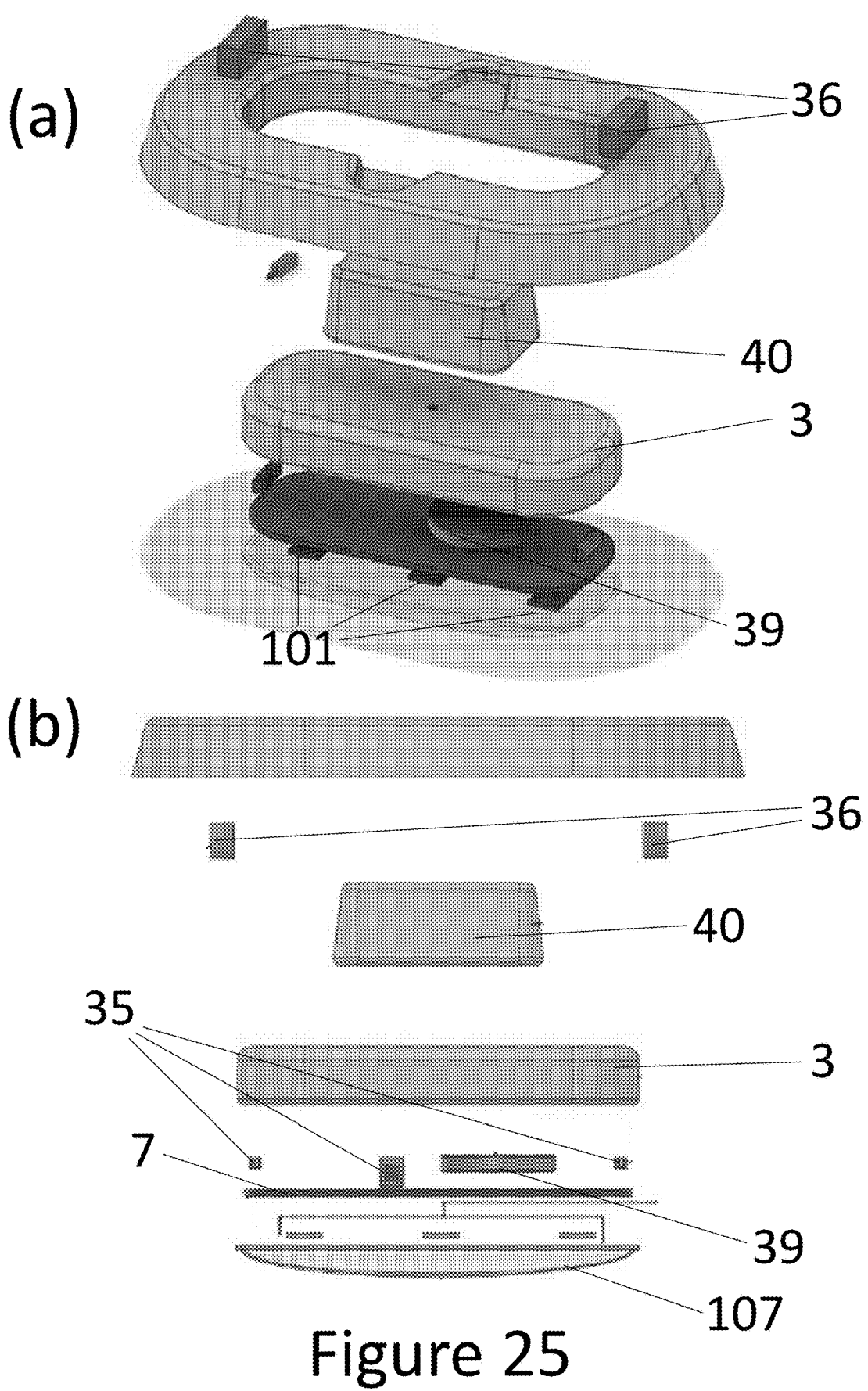
Figure 26:
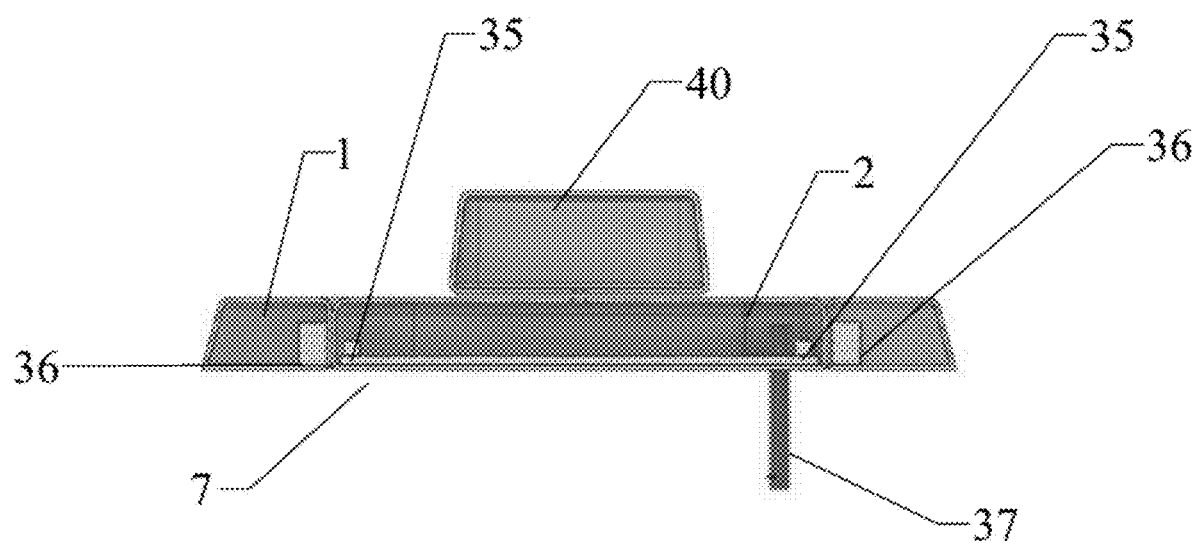
Figure 27:
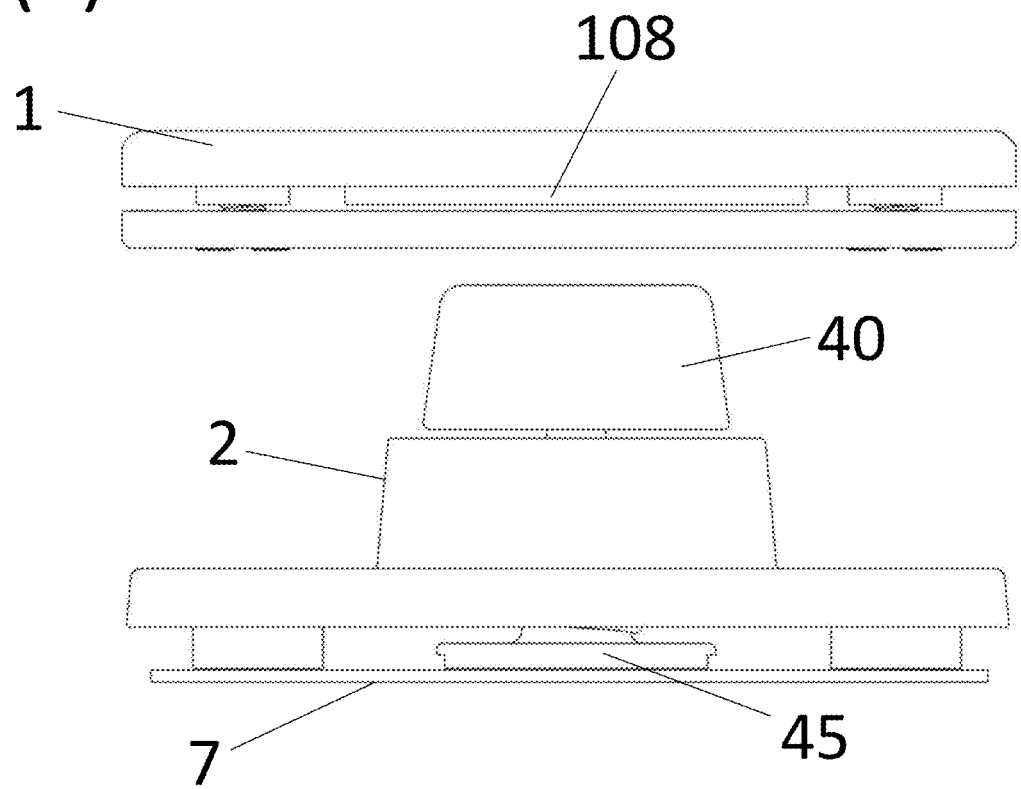
Figure 27:
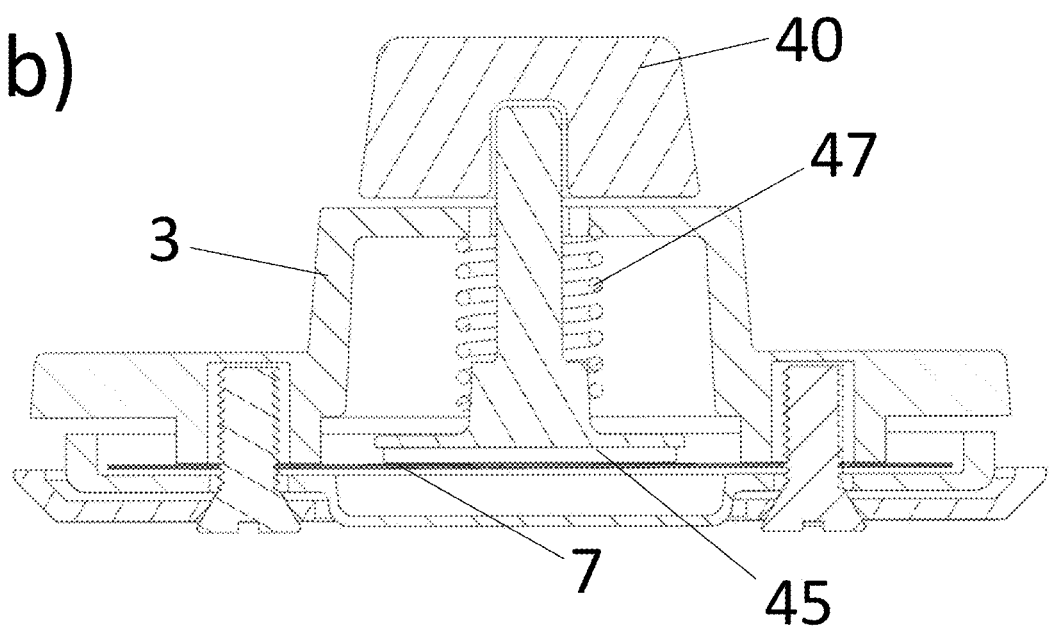
Figure 28:
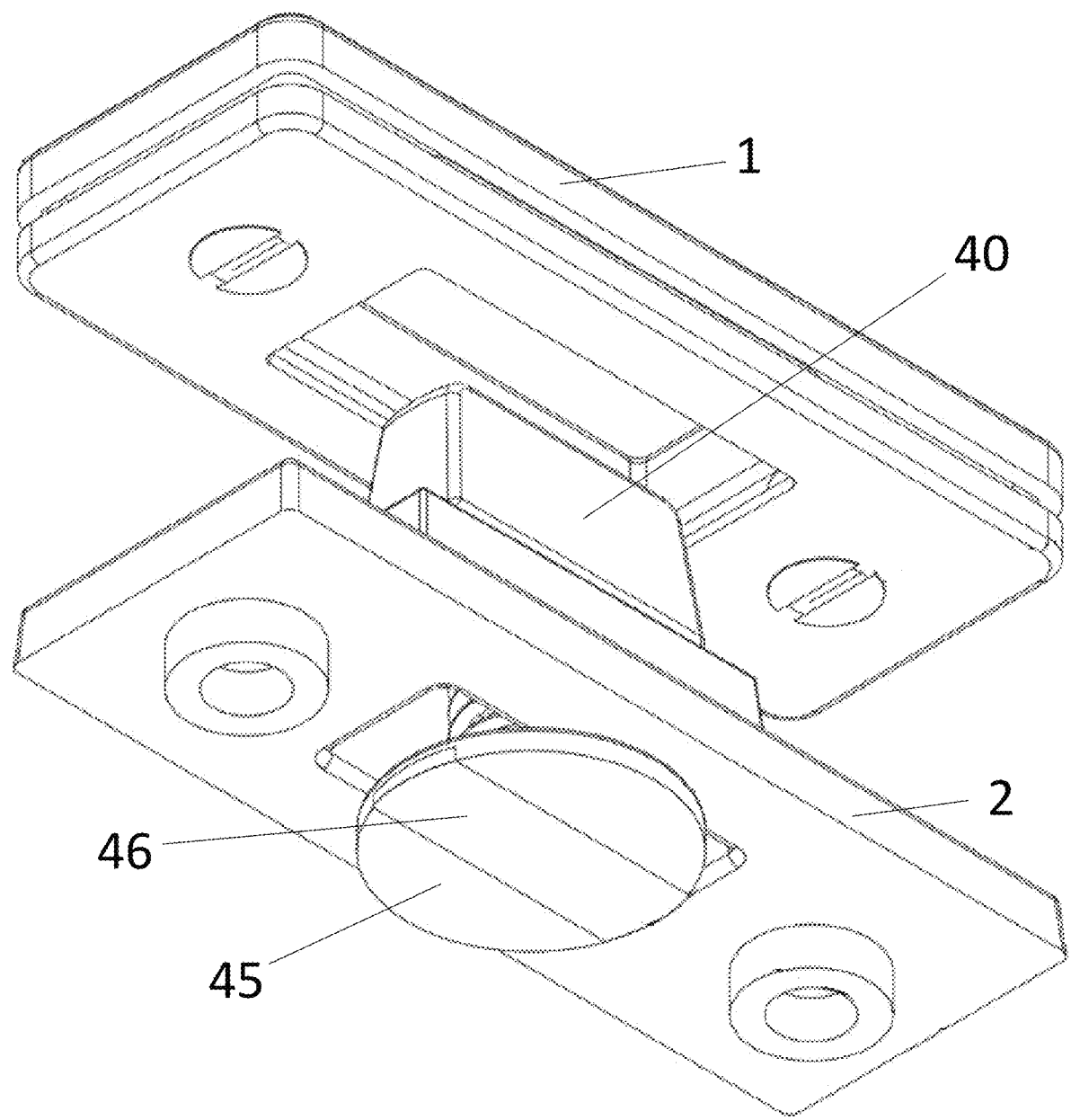
Figure 29:
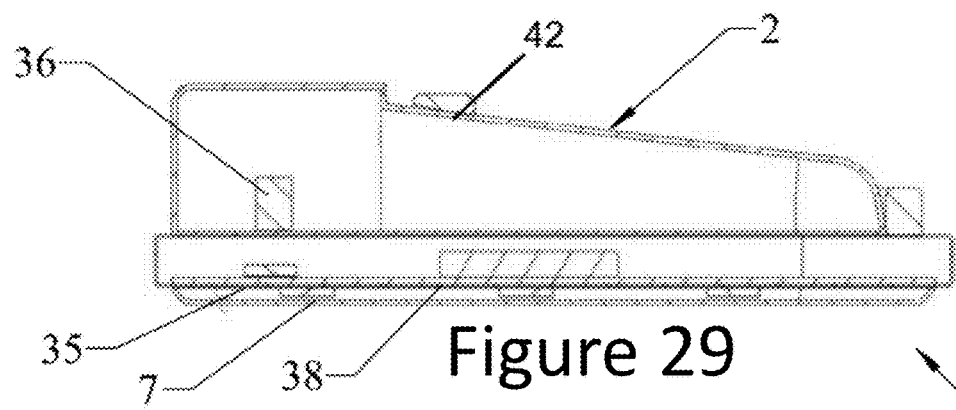
Figure 30:
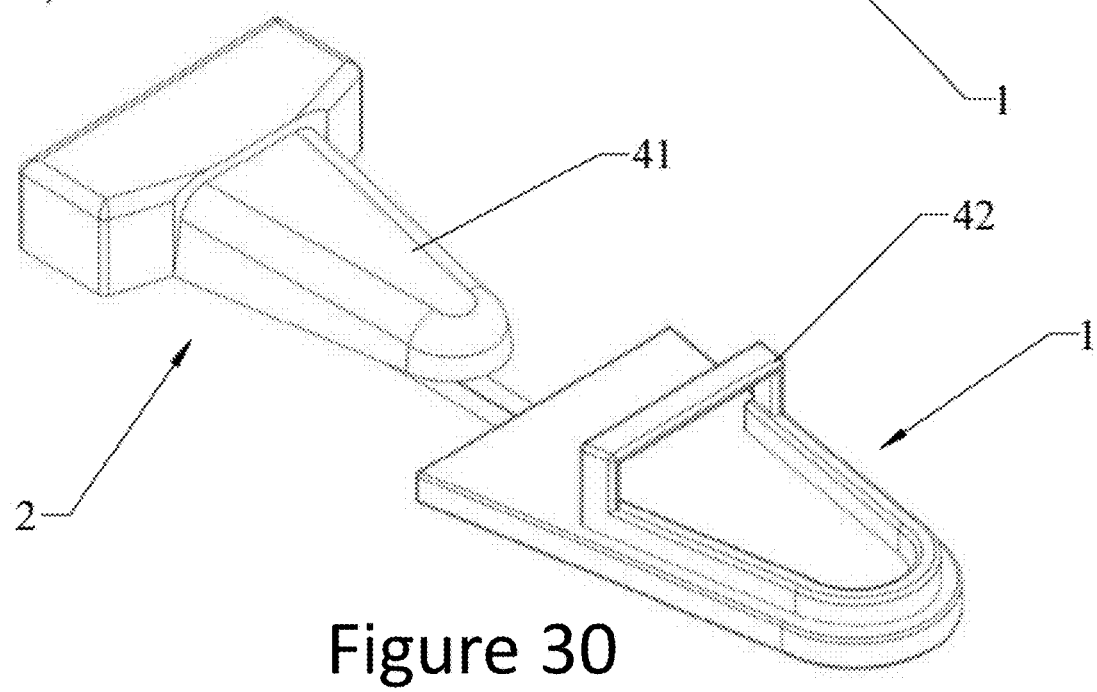
Figure 31:
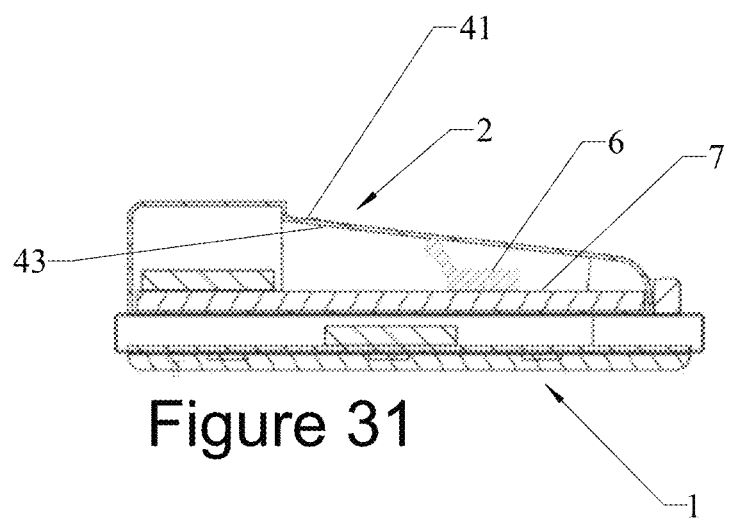
Figure 32:
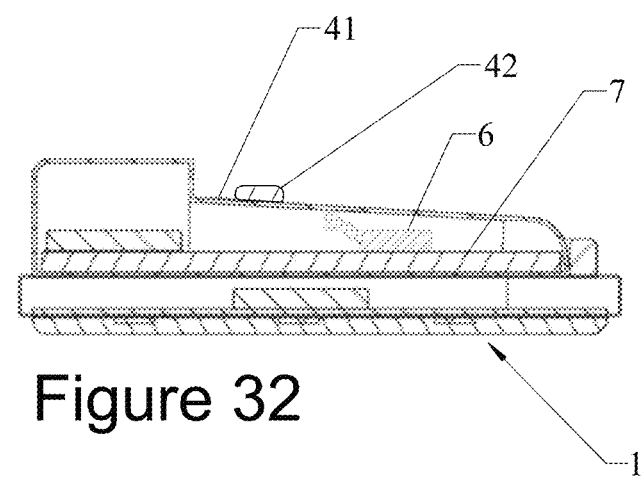
Figure 33:
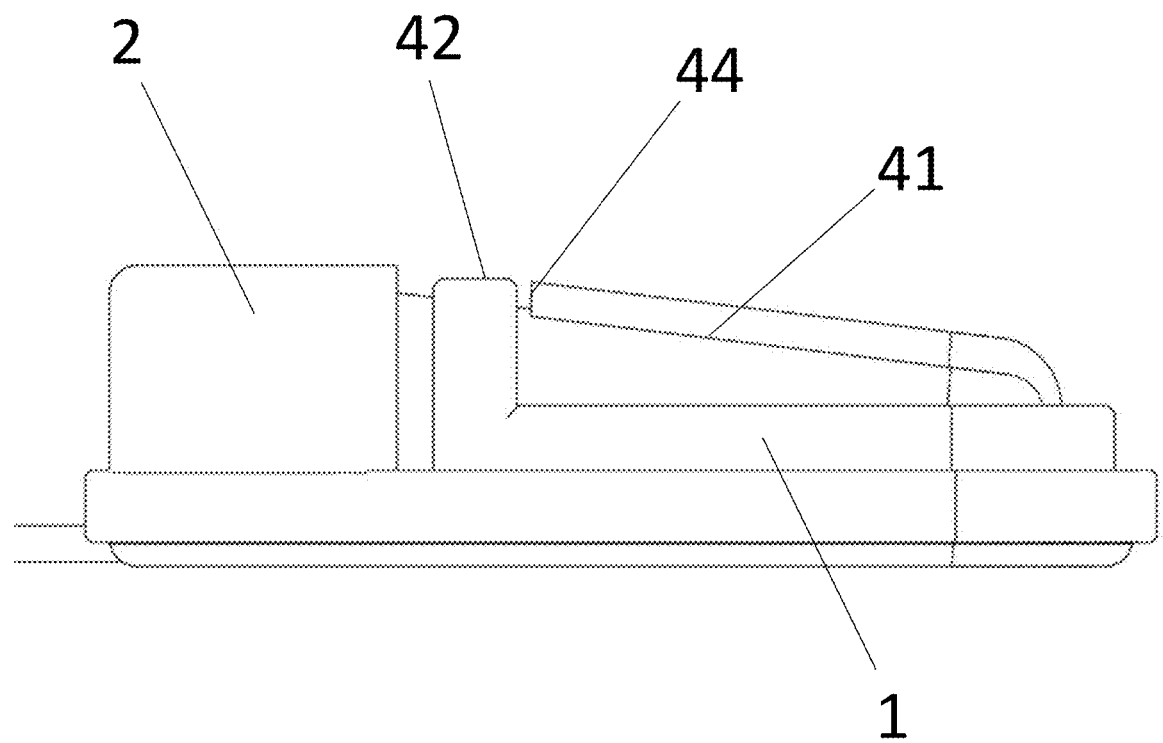

FIGS. 24(a) and (b) respectively show exploded perspective and exploded side views of the switch clasp of FIG. 23;

FIGS. 25(a) and (b) respectively show exploded perspective and exploded side views of a switch clasp comprising a rotor and a magnetic sensor;

FIG. 26 shows a cross-sectional side view of the switch clasp of FIGS. 25(a) and (b);

FIGS. 27(a) and (b) respectively show a side view and a cross-sectional side view of a switch clasp comprising a rotor and a rotating portion;

FIG. 28 shows a perspective view of the switch clasp of FIGS. 27(a) and (b);

FIG. 29 shows a cross-sectional side view of a switch clasp comprising a wedging surface, a magnetic sensor, and a hoop, with the first and second parts engaged;

FIG. 30 shows a perspective view of the switch clasp of FIG. 29 with the first and second parts separated;

FIG. 31 shows a cross-sectional side view of the male part of a switch clasp comprising a wedging surface and a lever switch;

FIG. 32 shows a cross-sectional side view of the switch clasp of FIG. 31 with the lever switch of the male part compressed by a hoop of the female part;

FIG. 33 shows a side view of a switch clasp with a male part comprising a wedging surface and a lip;

FIGS. 34(a)-(c) show plan views of a switch clasp comprising a zip and a magnetic sensor;

FIGS. 35(a)-(c) show plan views of a switch clasp comprising a zip and a set of conductive tracks joined to individual zip teeth; and FIGS. 36(a) and (b) respectively show side and perspective views of a fabric joined to a zip.

Corresponding reference numerals indicate corresponding parts throughout the several views of the drawings.

DETAILED DESCRIPTION

Example embodiments will now be described more fully with reference to the accompanying drawings.

The present disclosure concerns a switch clasp, that is an electrical switch capable of acting as a clasp or a clasp capable of acting as an electrical switch. By way of non-limiting example, the switch clasp may find application in garments or bags where the action of opening or closing the clasp can trigger an electrical signal. The switch clasp also provides the functionality of a clasp to allow a garment or bag to be clasped or fastened, for example in a bag the clasp may retain a closure flap in a closed condition. However the switch clasp may serve to temporarily secure any item or part of an item to another part of the item or any other item and to provide an indication via electrical signal to indicate that the item is secure or not.

Figure 1:
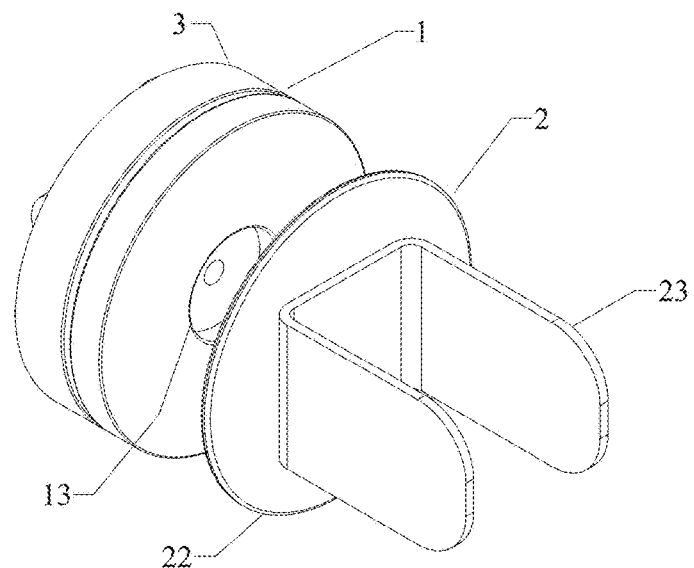
FIG. 1 shows a perspective view of separated first and second parts of a switch clasp.
Figures 2, 3:
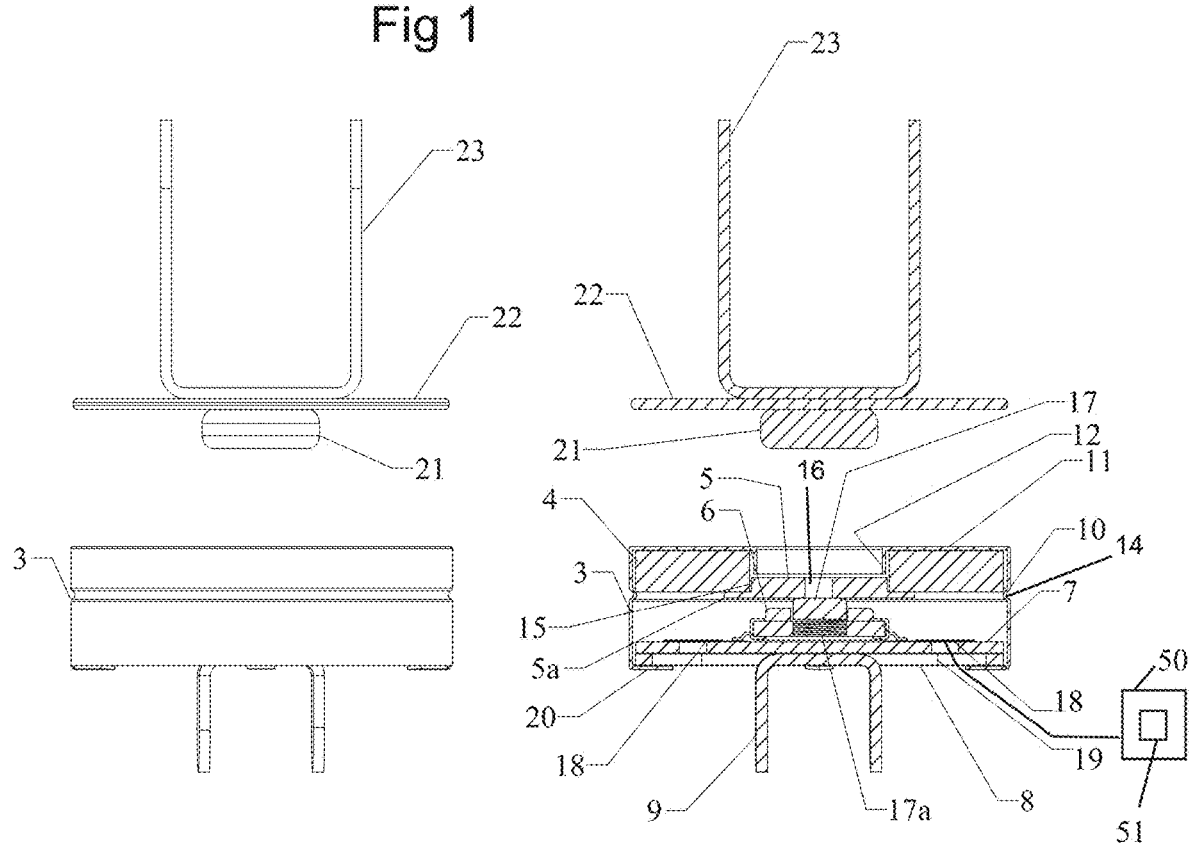
FIG. 2 shows a side view of the separated first and second parts of the switch clasp of FIG. 1.
FIG. 3 shows a cross-sectional side view of the separated first and second parts of the switch clasp of FIG. 1.

FIG. 1 shows a perspective view of a switch clasp in accordance with a first embodiment. FIGS. 2 and 3 respectively show a side view and a cross-sectional side view of the switch clasp assembly of FIG. 1.

The switch clasp of the first embodiment has a first part provided by a female assembly (also referred to as a "female part") 1 and a second part provided by a separable male part 2. The female assembly 1 comprises a housing 3, a permanent magnet 4 which provides an attractor, a float 5, a microswitch 6, circuit board 7, a cap 8 and a staple 9 providing a fastening structure. In other embodiments, the switch 6 is not a microswitch.

Housing 3 comprises a cylindrical outer wall 10 depending from an outer rim of an annular top 11. A cylindrical inner wall 12 depends from an axial aperture 13 formed in the top 11 providing an annular magnet chamber into which the annular magnet 4 is secured. The depth of the inner wall 12 is much less than the depth of the outer wall, roughly ¼ in the example, the depth of the magnet 4 is greater than the depth of the inner wall by a factor of about 2. The magnet 4 may be secured into the magnet chamber by adhesive, or a retaining rib 14 may be formed on the outer wall 10 so that the magnet is pressed into the housing during assembly (i.e., retaining rib 14 extends radially inwards from the outer wall 10 and abuts an underside of the magnet 4 to secure the position of the magnet 4). Additionally, or alternatively, the magnet 4 may be secured into the magnet chamber via a magnetic attraction to the housing 3. In embodiments comprising a retaining rib 14, the distance between the rib 14 and the top 11 is equal to the depth of the magnet 4.

Housing 3 can be made from, or comprise, any suitable rigid material. The housing may be formed from, or comprise, a metal, such as copper. The housing 3 may be formed from, or comprise, any suitable plastics. In some embodiments, the housing 3 is formed from, or comprises, a malleable, rigid material. In some embodiments, the housing 3 is formed from, or comprises a malleable, rigid material which is ferromagnetic or paramagnetic (i.e., experiences a positive magnetic attraction to permanent magnets).

The housing 3 may be waterproof. The female part 1 of the switch clasp may be waterproof so as to protect internal circuitry from water.

The switch clasp may have an operational temperature between −15° C. and 100° C. The switch clasp may be configured to withstand temperatures between −15° C. and 100° C. The switch clasp may be configured to protect the internal circuitry from temperature damage at temperatures between −15° C. and 100° C.

The float 5 comprises a thin disk 5a and a cylindrical boss 15 extends axially from the disk 5a to form a sliding fit in the annulus of the magnet 4. The radius of the cylindrical boss 15 is substantially identical to the radius of the axial aperture 13, such that the cylindrical boss 15 can freely slide within the aperture 13. A through hole 16 may be formed on the axis of the float 5. Monostable microswitch 6 is installed beneath the float 5. The switch 6 has two switch states, on and off. An actuator pin 17 of the microswitch is urged by means of a spring 17a to press against the underside of the float 5 so that the float 5 is pressed against the magnet 4 as shown in FIG. 3. The through hole 16 can be configured to maintain the magnetic flux lines therethrough. The microswitch 6 is mounted onto the disk-shaped circuit board 7 to provide electrical connections 18. The switch 6 is soldered onto the circuit board 7.

Electrical connections 18 are aligned with apertures 19 formed into the cap 8 whereby connection can be made with conductors of an external circuit 50. Electrical connections 18 are electrically conductive positions on the circuit board 7 which align with the apertures 19. External conductors may be provided to provide means for electrical conduction between the electrical connections 18 and external circuitry 50. For example, electrical connections 18 may be configured to electrically connect the circuit board 7, together with the microswitch 6 mounted thereon, to an external circuit 50. The external circuit 50 may comprise a power source, such as a battery. The external circuit may comprise one or more output devices 51, such as LEDs, bulbs, buzzers, speakers, vibration means, silent alarms, locating means, etc. The external circuitry may be configured to provide further electronic processing, or communication with an external device, such as a smart phone, etc. Electrical connections 18 can be electrically connected to an external circuit via conductive wires (e.g., copper wires) threaded through the apertures 19. In other embodiments, ribbon cables or any other suitable means may be used instead of conductive wires to connect the circuit board 7 to an external circuit 50.

Figure 7:
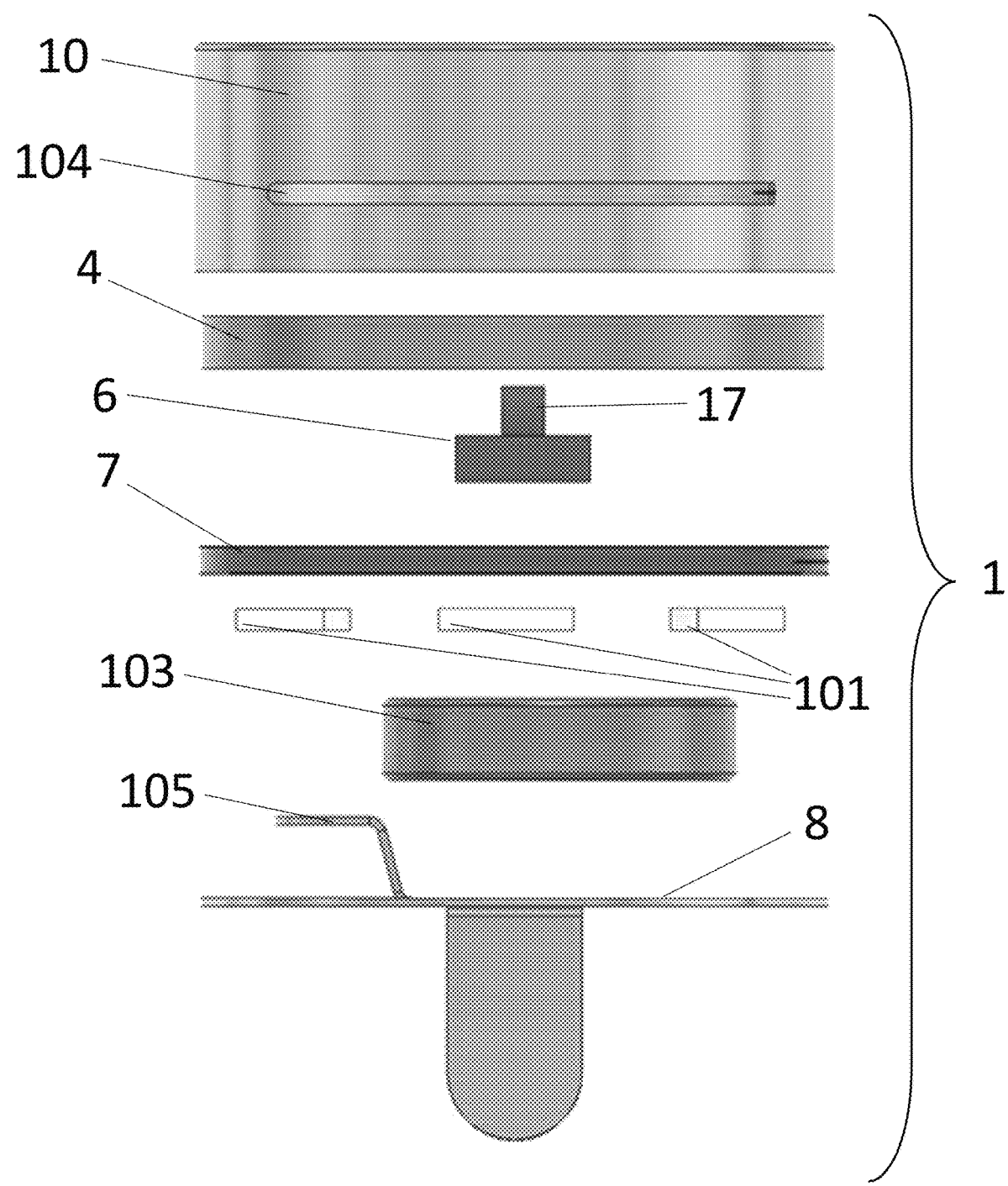
FIG. 7 shows an exploded side view of a female part of a switch clasp comprising a power source and output devices.

In other embodiments, such as the embodiment shown in FIG. 7, the power source and the output devices are integral with the female part 1 of the clasp and, in such embodiments, there may be no external circuit. In such embodiments, the apertures 19 and the electrical connections 18 may be omitted. In other embodiments, only one of the power source or the output device(s) are integral with the female part 1, and an external circuit will still be required.

The cap 8 is a disc of a plastically deformable material such as a metal or plastics worked, for example via stamping, to form a pair of limbs into a projecting staple 9 to provide a fastening structure for the female part 1. In some embodiments, the staple 9 is a separate component which is connected to the cap 8. In such examples, the staple 9 may be connected to the cap 8 via an adhesive, via a screw, or via any other suitable means. The cap 8 is secured into an open base of the housing 3 via deforming clip features 20 projecting from the lower rim of the outer wall 10. When assembled, the circuit board 7 abuts a first side of the cap 8, and the deforming clip features 20 abut a peripheral edge of a second side of the cap 8.

To disassemble the female part 1, the cap 8 is removed. To remove the cap 8 from the housing 3, a user exerts a force on the cap, which in turn exerts a force on the deforming clip features 20. The user may exert a force on the cap 8 via the staple 9. In some embodiments, the cap 8 comprises holds (not shown) which enable a user to securely grip the cap 8 in order to exert a force onto the cap 8.

The cap 8, circuit board 7, microswitch 6, float 5 and magnet 4 form a tight fit within the housing 3, as shown clearly in FIG. 3, such that each of the components are retained in a fixed position relative to each other.

In other embodiments, such as those shown in FIGS. 8-16, the cap 8 may be replaced with a cover 26.

The male part 2 is formed from a cylindrical projection 21 dimensioned to fit into the aperture 13. The projection 21 is concentrically mounted onto a disk 22 formed of a ferromagnetic or paramagnetic material, such as steel, which is attracted to the annular magnet 4. The disk 22 acts as a complementary attractor. In variants the disk 22 may be a permanent magnet to enhance the attractive force between the disk 22 and the magnet 4. A staple 23 is secured to the back of the disk 22 via spot welding to provide a fastening structure for the second male part. In other embodiments, the staple 23 is secured to the back of the disk 22 via an adhesive glue, or any other suitable means.

The shape and size of the disk 22 of the male part 2 is substantially identical to the shape and size of the top surface 11 of the housing 3 of the female part 1. However, this is not essential.

Although the embodiment of FIGS. 1-3 shows a projection 21 concentrically mounted onto a disk 22, it is not essential that the projection 21 is central. In other embodiments, the projection 21 may be mounted anywhere on the disk 22. Similarly, the aperture 13 of the female part 1 is not limited to being a central aperture. The aperture 13 must be configured to receive the projection 21.

In use, the female assembly 1 is secured to an item, or part of an item, such as the body of a handbag, by passing the limbs of the staple 9 through a membrane (otherwise referred to as a "web") part of the bag. The male part 2 is secured to another item or part of the item such as a closure flap of the bag by passing the limbs of the staple 23 through a corresponding membrane part of the flap. The male and female parts 2, 1 may be used in place of a standard clasp. The male and female 2, 1 parts may be secured to opposing sides of a bag, such as a handbag, so as to provide a fastening means for the bag. The male and female parts 2, 1 may be secured respectively to a bag and to a closure flap of said bag, or vice versa, so as to provide a fastening means for the bag.

In some embodiments, one or both of the staples 23, 9 are replaced with alternative fastening structures. In some embodiments, an adhesive may be used to fasten the male and/or female parts 2, 1 to the relevant parts (e.g., membrane, closure flap) of the item (e.g., a bag, a garment, etc.). In some embodiments, disk 22 may comprise a plurality of sewing holes configured to enable sewing of the male part 2 to its respective part. In some embodiments, cap 8 may comprise a plurality of sewing holes configured to enable sewing of the female part 1 to its respective part.

Figure 4:
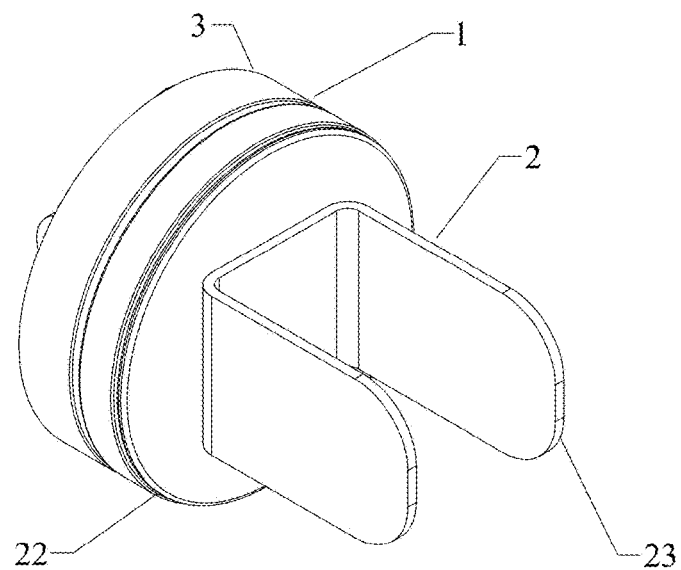
FIG. 4 shows a perspective view of engaged first and second parts of the switch clasp of FIG. 1.
Figures 5, 6:
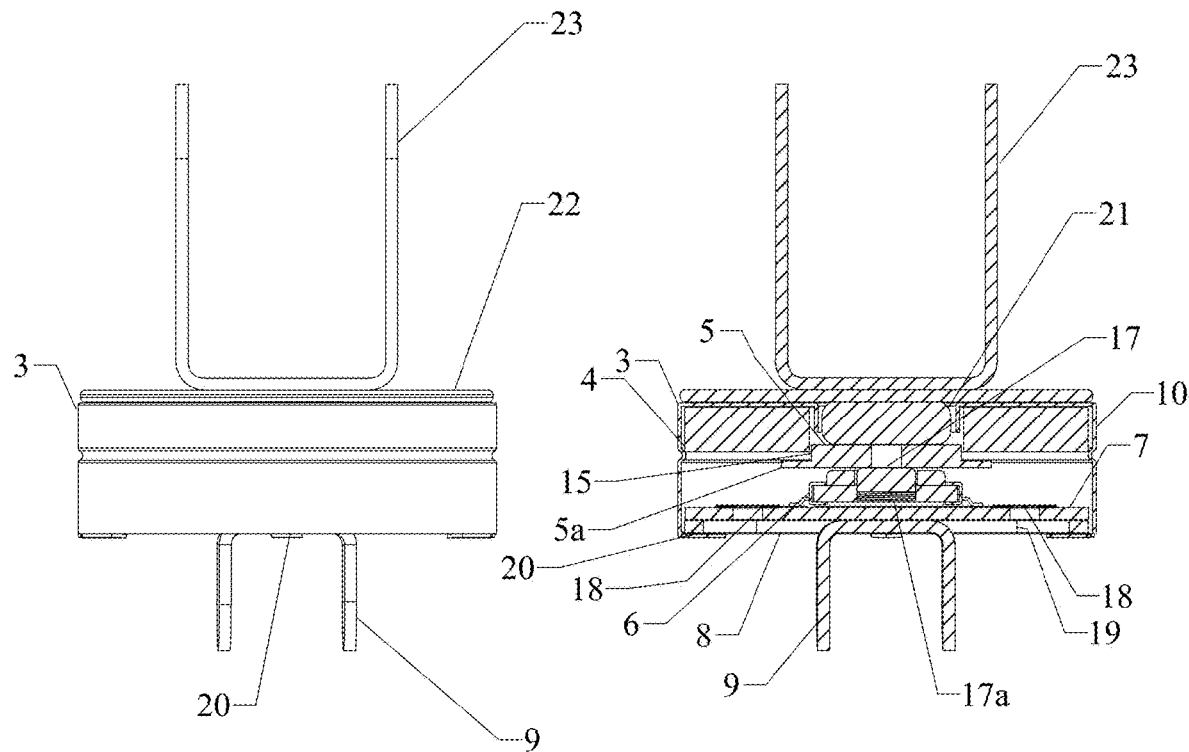
FIG. 5 shows a side view of the engaged first and second parts of the switch clasp of FIG. 1.
FIG. 6 shows a cross-sectional side view of the engaged first and second parts of the switch clasp of FIG. 1.

When the male part 2 is brought into proximity with the female part 1, forces generated by the magnet 4 attract the disk 22 so that the projection 21 is drawn into the aperture 13 until the disk 22 contacts the top 11 of the housing 3. The depth of the projection 21 exceeds the depth of the magnet 4 so that it presses on the float 5. The projection 21 therefore displaces the float 5 from the magnet 4 to a degree necessary to switch the state condition of the microswitch 6 (i.e., to turn the switch on or off). FIGS. 4-6 show the male part 2 received inside the female part 1 (i.e., the male part 2 and the female part 1 are engaged).

The provision of the float 5 ensures that the action of the spring 17a is to provide a continuous compression force which urges the circuit board 7 and the cap 8 against the retaining clips 20 and keeps each of the circuit board 7 and cap 8 in place. The float 5 is not an essential feature of the disclosure and is removed in other embodiments, such as the embodiment of FIG. 7.

When the terminals 18 (also referred to as "electrical connections") of the microswitch 6 are connected in a control circuit, the change of state of the microswitch 6 can be used to switch a light on or off in a handbag or to trigger an alarm to indicate unauthorized opening of the clasp when the alarm has not been disabled first. The switch 6 can be used as part of any external circuit. The switch 6 can be used as a switch for an external circuit which is connected via connections 18. The external circuit may be housed within the same item as the clasp (e.g., the external circuit may be housed in or connected to a bag).

Although FIGS. 1-6 show the male part 2 comprising a cylindrical projection 21 and the female part 1 comprising a circular aperture 13, in other embodiments the projection 21 and aperture 13 can have any other shape as long as the projection 21 is configured to fit within the aperture 13. For example, the aperture 13 could be square, rectangular, triangular, etc.

Although FIGS. 1-6 show the male and female parts 2, 1 as having a circular cross section (i.e., they are substantially cylindrical), they may have any other cross-sectional shape in other embodiments.

As briefly described above, FIGS. 4-6 correspond to FIGS. 1-3, but with the male part 2 brought into connection with the female part 1. As shown in FIG. 6, the spring 17a is compressed via actuator pin 17 to change the switch state (i.e., on/off, open circuit or closed circuit) of microswitch 6. The actuator pin 17 is held in a compressed position via projection 21, which in turn is held in place via the magnetic force between the magnet 4 and the disk 22. The magnetic force between the magnet 4 and the disk 22 is sufficiently strong to compress spring 17a by a sufficient amount to change the state of the switch 6.

The switch 6 described above and shown in FIGS. 1-6 is a push-button switch. Compressing the actuator pin 17 may alter the switch state of the switch 6 (i.e., to turn the switch on or off). In other embodiments, any other suitable type of switch 6 may be used. For example, in some embodiments, such as the embodiment of FIG. 11, the switch 6 is a lever switch, and projection 21 is configured to actuate a lever to change the switch state of the lever switch (i.e., turn the switch on or turn the switch off).

In other embodiments, the switch 6 may be configured to detect the presence of magnet 4. In such embodiments, the switch 6 can be disposed in either the male part 2 or the female part 1, and a magnet can be disposed in an opposing part. In such embodiments, the switch 6 may be a hall effect sensor or a reed switch. Such embodiments are described later in the specification, for example, with reference to FIGS. 16 and 17.

As explained above, electrical connections 18 enable the switch 6 to be electrically connected with external circuitry, and the external circuitry may comprise one or more output devices. Connecting the male and female parts 2, 1, and thus actuating the switch 6, can activate or deactivate the one or more output devices.

FIG. 7 shows an exploded side view of a female part 1 of a switch clasp in accordance with another embodiment. The male part (not shown) of this embodiment is substantially identical with the male part 2 of the embodiment of FIGS. 1-6.

The circuit board 7, microswitch 6 and magnet 4 are identical to the corresponding components in the embodiment of FIGS. 1-6, but the float is removed. When assembled, the actuator pin 17 of the microswitch 6 extends into the aperture of the magnet 4 such that, in use, the projection 21 of the male part 2 directly applies a force to the actuator pin 17, rather than the float, to operate the switch 6. In other embodiments, the switch 6 may be any other suitable type of switch, such as a lever switch, as previously explained.

Female part 1 comprises output devices 101 and a battery 103. The battery is a coin cell in this embodiment, but in other embodiments it may be any other type of battery or power supply. In the embodiment of FIG. 7, there are three output devices 101, but in other embodiments there may be one output device, two output devices, or any other number of output devices.

When assembled, the output devices 101 are mounted onto and/or electrically connected to the circuit board 7 (for example, the output devices 101 can be soldered to the circuit board 7). The battery 103 is mounted onto and/or electrically connected to the circuit board 7. The battery 103 supplies electrical power to the circuit board 7 and the other circuitry within the female part 1. In the embodiment shown in FIG. 7, the cap 8 comprises a battery connection 105. The battery connection 105 is configured to hold/fix the battery 103 in place against the circuit board 7 when assembled such that, when a user disassembles the female part 1 and removes the cap 8, the battery 103 is loose and can be replaced. Alternatively, or additionally, the battery connection 105 may provide an electrical connection between the battery 103 and the circuit board 7.

Unlike the embodiment of FIGS. 1-6, the cap 8 does not comprise apertures 19, as the output devices 101 and battery 103 are housed within the housing 3 of the female part 1. Including both the battery 103 and the output devices 101 within the female part 1 removes the need for the clasp to be connected to any external circuitry. For example, the circuit board 7 can be used to provide a circuit with the battery 103, the output devices 101 and the switch 6 in a simple series circuit. In such an embodiment, activating the switch 6 (via the projection 21 of the male part 2) turns the output devices 101 on/off. The output devices 101 may be bulbs, LEDs, audio devices, etc. In other embodiments, the cap 8 still comprises the apertures, and the female part 1 may be connected to external circuitry to provide additional functionality.

The outer wall 10 of the housing 3 comprises a slot 104. The slot 104 prevents the outer wall 10 from blocking the outputs of the output devices 101. For example, in embodiments in which the output devices 101 are LEDs or bulbs, the slot 104 enables light to pass therethrough to leave the housing 10 and illuminate the area surrounding the female part 1 of the switch clasp. In embodiments where the output devices 101 comprise buzzers, speakers, or any other type of audio device, the slot 104 enables sound to travel therethrough unimpeded. In other embodiments, the housing 3 may comprise a plurality of slots 104. In other embodiments, the housing 3 comprises one or more alternatively shaped passages instead of a slot 104. For example, the housing 3 may comprises one or more holes having any shape and size.

In other embodiments, the female part 1 may comprise the battery 103 without also comprising the output devices 101, or vice versa. In such embodiments, the cap 8 comprises one or more apertures 19 to enable connection to external circuitry.

Figure 8:
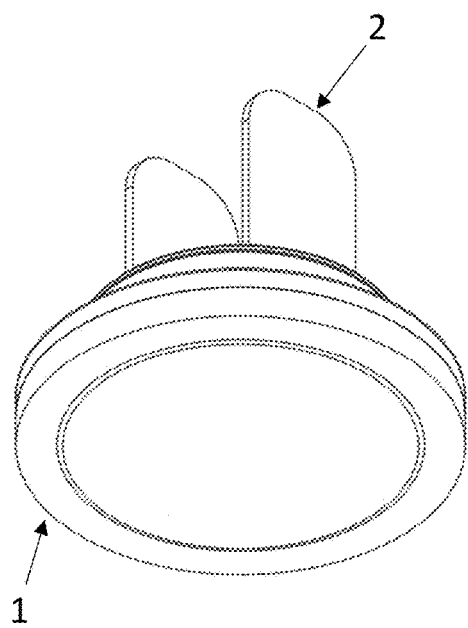
FIG. 8 shows a perspective view of a switch clasp comprising a cover and a second switch.
Figure 9:
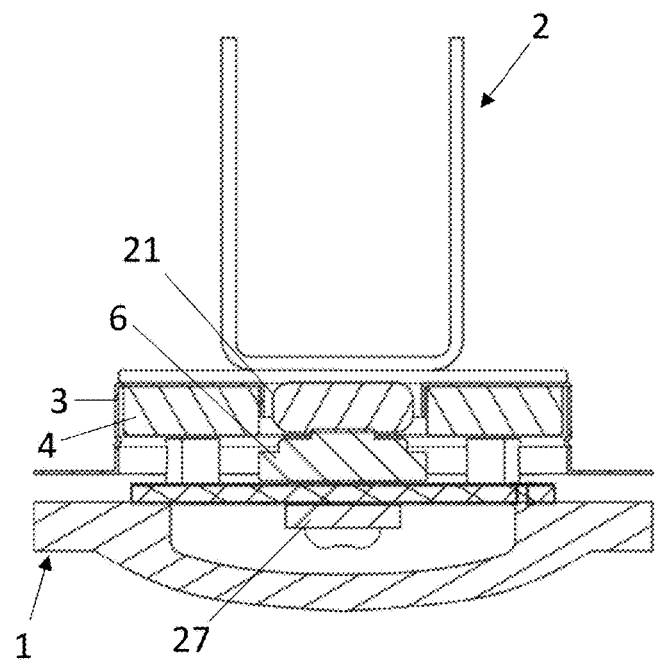
FIG. 9 shows a cross-sectional side view of the switch clasp of FIG. 8 with the first and second parts engaged.
Figure 10:
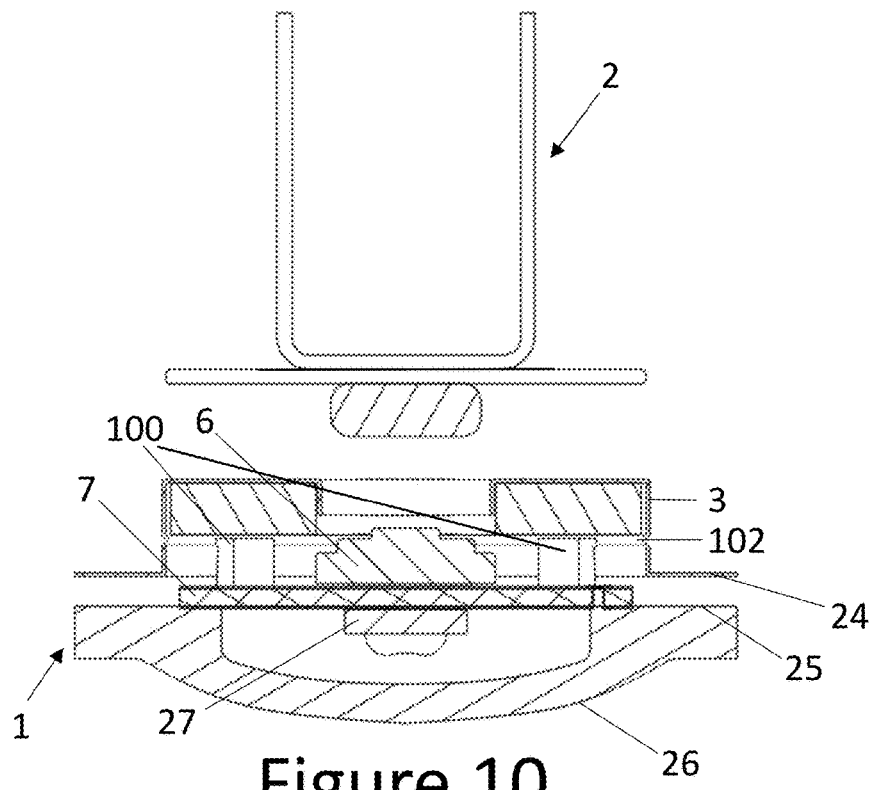
FIG. 10 shows a cross-sectional side view of the switch clasp of FIG. 8 with the first and second parts separated.

Another embodiment of the disclosure is shown in FIGS. 8 to 10 which differs from the embodiment of FIGS. 1-6 in that the float 5 is omitted, as is the staple 9. The male part 2 of the switch clasp is the same as in the embodiment of FIGS. 1-6.

Instead of a staple 9, the female part 1 is adapted to be secured to a web (also referred to herein as a "membrane") during use by means of an annular flange 24 extending around the housing 3. The flange 24 cooperates with a flange 25 formed on a resiliently deformable monostable cover 26 to clamp the web therebetween and hence provide a fastening structure. The cover 26 is dome shaped. The cover 26 in the embodiments of FIGS. 8-10 is used instead of a cap.

The cover 26 comprises resiliently deformable clasp teeth 100 which are used to clamp the flanges 24, 25 together. The housing 3 comprises an internal rib 102 configured to engage with the clamping teeth 100 so as to fix the position of cover 26 relative to the housing 3. When assembled, clasp teeth 100 engage with the internal rib 102 formed in the housing 3 to securely fix the position of the flanges 24, 25 relative to each other. The internal rib 102 is a radial projection extending inwardly from the outer wall 10 of the housing 3. The clasp teeth 100 are configured to enter the housing 3 and engage with the internal rib 102. Each of the clasp teeth 100 comprise a hook portion, and the clasp teeth 100 "engage" the internal rib 102 when the hook portions are positioned between neighboring internal ribs 102.

Figure 11:
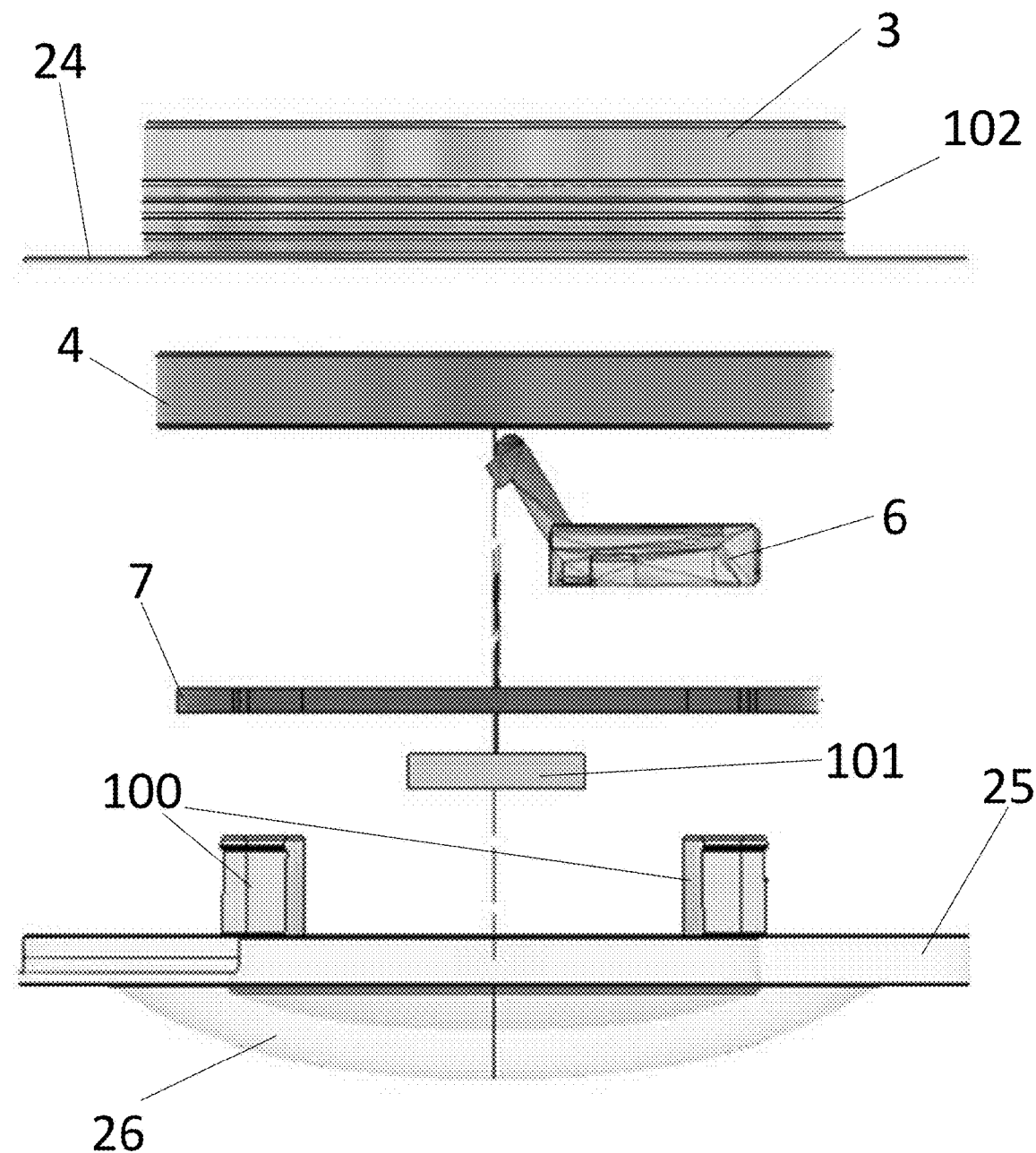
FIG. 11 shows an exploded side view of a switch clasp comprising a lever switch.

In other embodiments, such as that shown in FIG. 11, there is a plurality of internal ribs 102 to enable the clasp teeth 100 to be inserted into the housing 3 by various distances. The ability to secure the clasp teeth 100 on any of the plurality of internal ribs 102 of the housing 3 enables the flanges 24, 25 to be fixed relative to each other at various distances, which enables the flanges 24, 25 to clamp a range of materials with different thicknesses.

In other embodiments, the clasp teeth 100 and internal ribs 102 can be replaced with correspondingly threaded portions on the housing 3 and the cover 26.

The dome like cover 26 can be temporarily deformed by the pressure of a finger or similar to actuate a second micro-switch 27. Alternatively, the dome 26 can comprise a hole through which an actuator of the switch 27 extends such that a user can actuate the switch 27. The second microswitch 27 is mounted on the opposite side of the circuit board 7 to the first microswitch 6 and located substantially on the central axis of the switch clasp. The second microswitch 27 thus provides additional logic to the switch clasp, for example enabling an alarm to be disabled by pressing the button formed by the cover, which would otherwise be activated by opening the clasp. In another embodiment, second microswitch 27 is used to deactivate an LED or other output device, or external circuitry. In the embodiment of FIGS. 8-10, the second micro-switch 27 is a push-button switch. In other embodiments, the second micro-switch 27 is a lever actuated switch. In some embodiments, the female part 1 comprises a cover 26 but not a second microswitch.

In some embodiments, the circuit board 7 is connected to external circuitry/components via suitable conductive means (e.g., conductive wires, conductive ribbons), as is described in relation to other embodiments. In some examples, the conductive means pass between the flanges 24, 25 to provide electrical connections between the circuit board 7 and external circuitry/devices. In other embodiments, the cover 26 comprises on or more holes through which conductors can extend.

FIG. 11 shows an embodiment of a switch clasp which is substantially similar to the embodiment of FIGS. 8-10. FIG. 11 shows an exploded side view of the female part 1 of the switch clasp. The male part 2 (not shown) of the switch clap of this embodiment is the same as in the first embodiment of FIGS. 1-6.

The switch clasp comprises a dome-like cover 26 together with flanges 24, 25, as in the embodiment of FIGS. 8-10. The switch clasp of FIG. 11 does not comprise a second microswitch.

FIG. 11 shows resiliently deformable clasp teeth 100 formed on, and extending from, the dome like cover 26. When assembled, clasp teeth 100 engage with internal ribs 102 formed in the housing 3 to securely fix the position of the flanges 24, 25 relative to each other, as in the embodiment of FIGS. 8-10.

In the embodiment of FIG. 11, the switch 6 is a lever switch, rather than push button switch. When the male part 2 is received within the female part 1, the magnetic force between magnet 4 and disk 22 causes the projection 21 to actuate a lever of the switch 6 to change the switch state.

In some embodiments, one or more output devices 101 are installed on, and/or electrically connected to, the circuit board 7. The one or more output devices 101 may comprise one or more of: lights, buzzers, alarms, speakers, etc. In the example of FIG. 11, the second microswitch 27 is omitted in favor of the output device 101. However, in other embodiments, the switch clasp may comprise a second microswitch 27 as well as one or more output devices 101. In embodiments comprising output devices 101 within the female part 1, the circuit board 7 may be connected to external circuitry to provide a power supply (e.g., the circuit board 7 may be connected to a battery).

Figure 12:
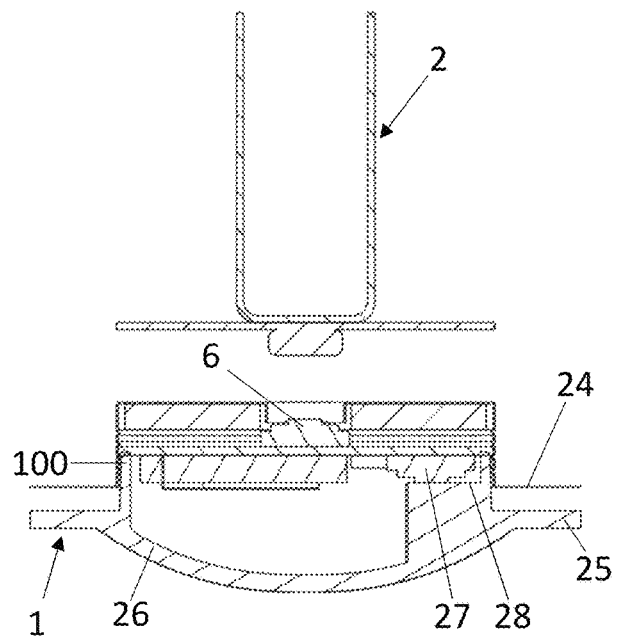
FIG. 12 shows a cross-sectional side view of a switch clasp comprising a cover with a shoulder, with the first and second parts separated.
Figure 13:
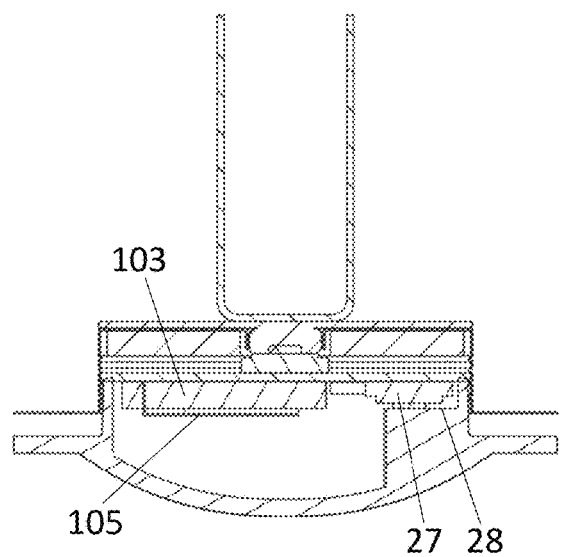
FIG. 13 shows a cross-sectional side view of the switch clasp of FIG. 12 with the first and second parts engaged.

FIGS. 12 and 13 show cross-sectional side views of a clasp switch in accordance with another embodiment. The embodiment of FIGS. 12 and 13 is generally similar to the embodiment of FIGS. 8-10 but differs in that the second microswitch 27 is eccentrically mounted on the circuit board 7 near the periphery of the cover dome 26. The interior surface of the cover dome 26 is formed with a shoulder 28 which forms a space between the circuit board 7 and the cover 26 just sufficiently large to accommodate the microswitch 27 in its relaxed state, when the cover 26 is in its stable state. By virtue of this arrangement only minimal movement of the cover 26 is required to depress and activate the second microswitch 27. This reduces the deformation of the cover 26 required and thus enhances the durability of the cover 26.

The embodiment of FIGS. 12 and 13 also differs from the embodiments of FIGS. 8-10 in that a coin cell battery 103 is connected to the circuit board 7 via a battery connection 105. This is not an essential feature, and an external power source may instead be connected to the circuitry within the female part 1.

Figure 14:
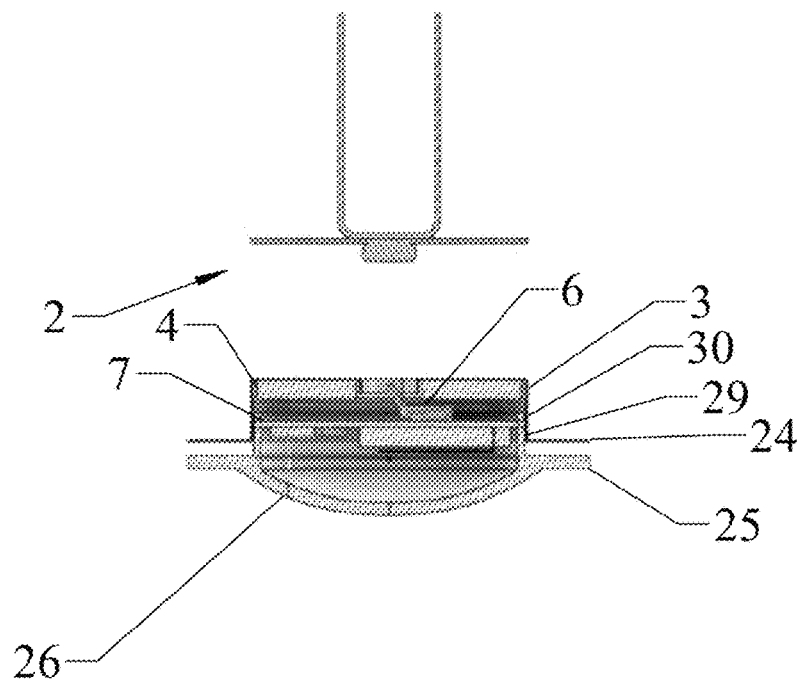
FIG. 14 shows a cross-sectional side view of a switch clasp comprising a power source and a lever switch with the first and second parts separated.

FIG. 14 shows a cross-sectional side view of a switch clasp in accordance with another embodiment.

The female part 1 of this embodiment is generally similar to the female parts 1 in the embodiments of FIGS. 8-10 and 12-13, but the microswitch 6 is of lever actuated type instead of the press button type. Instead of using clip teeth 100, the cover 26 is provided with a threaded sleeve 29 which supports the circuit board 7. The threaded sleeve 29 facilitates securing the cover 26 into a correspondingly threaded outer wall 30 of the housing 3 from which the flange 24 extends. As the cover 26 is screwed into the housing 3 through a correspondingly sized hole in a web, the flange 25 will clamp the web against the flange 24.

Figure 15:
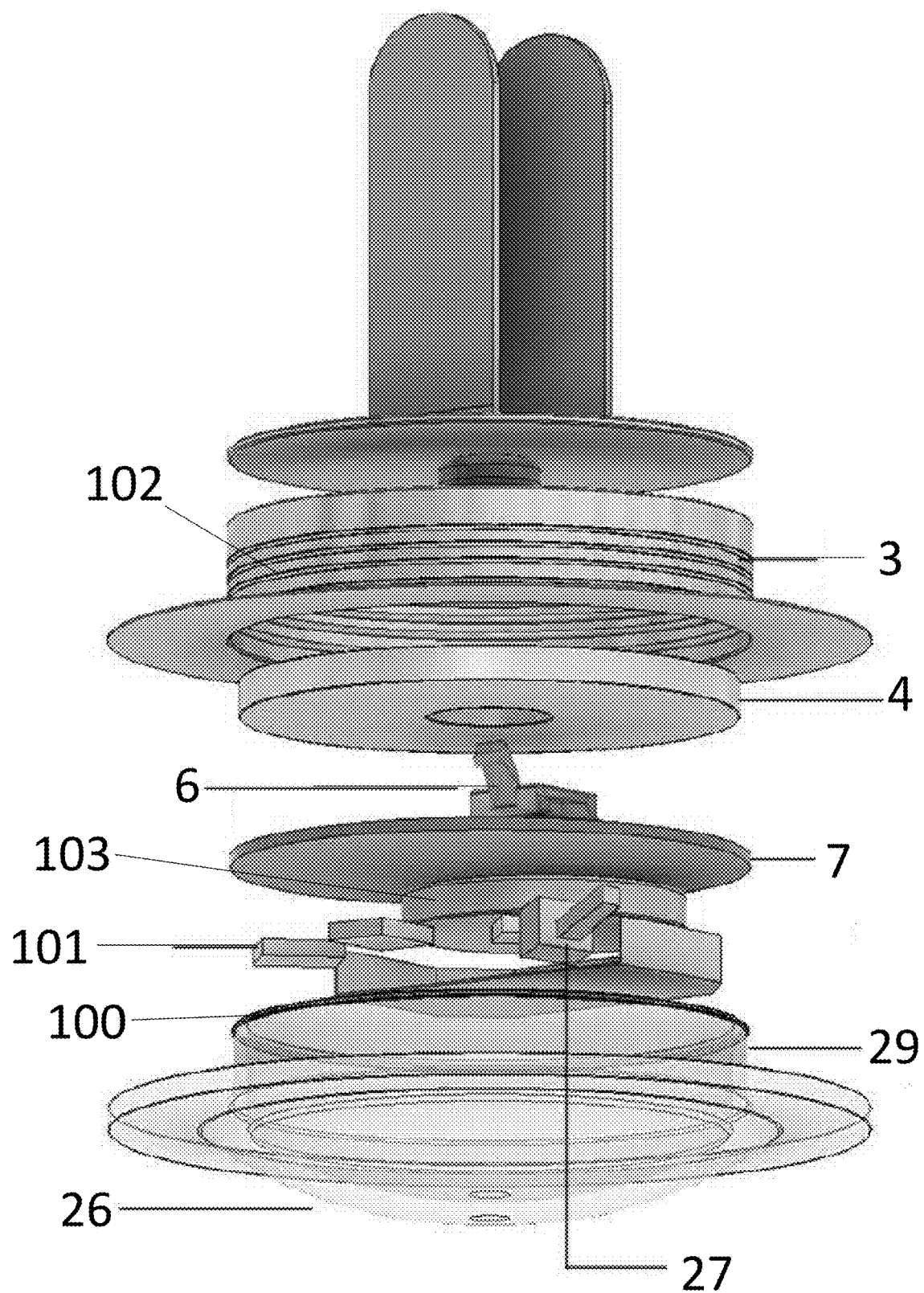
FIG. 15 shows a perspective exploded view of a switch clasp comprising a power source, output devices, and a second switch, with the parts separated.

FIG. 15 shows an exploded perspective view of a switch clasp in accordance with another embodiment. The embodiment of FIG. 15 is substantially similar to the embodiment of FIG. 14, except the sleeve 29 is not threaded. Instead, the sleeve comprises a clasp tooth 100. The housing 3 comprises a plurality of annular ribs 102 which extend inwards from the outer wall 10. The clasp tooth 100 is configured to engage with an annular rib 102 to clamp the flanges 24, 25 together.

In the embodiments of FIGS. 14 and 15, the female part 1 comprises a coin cell battery 103 and output devices 101. In such embodiments, there is no need to connect the circuit board 7 or the switch 6 to external circuitry.

Figure 16:
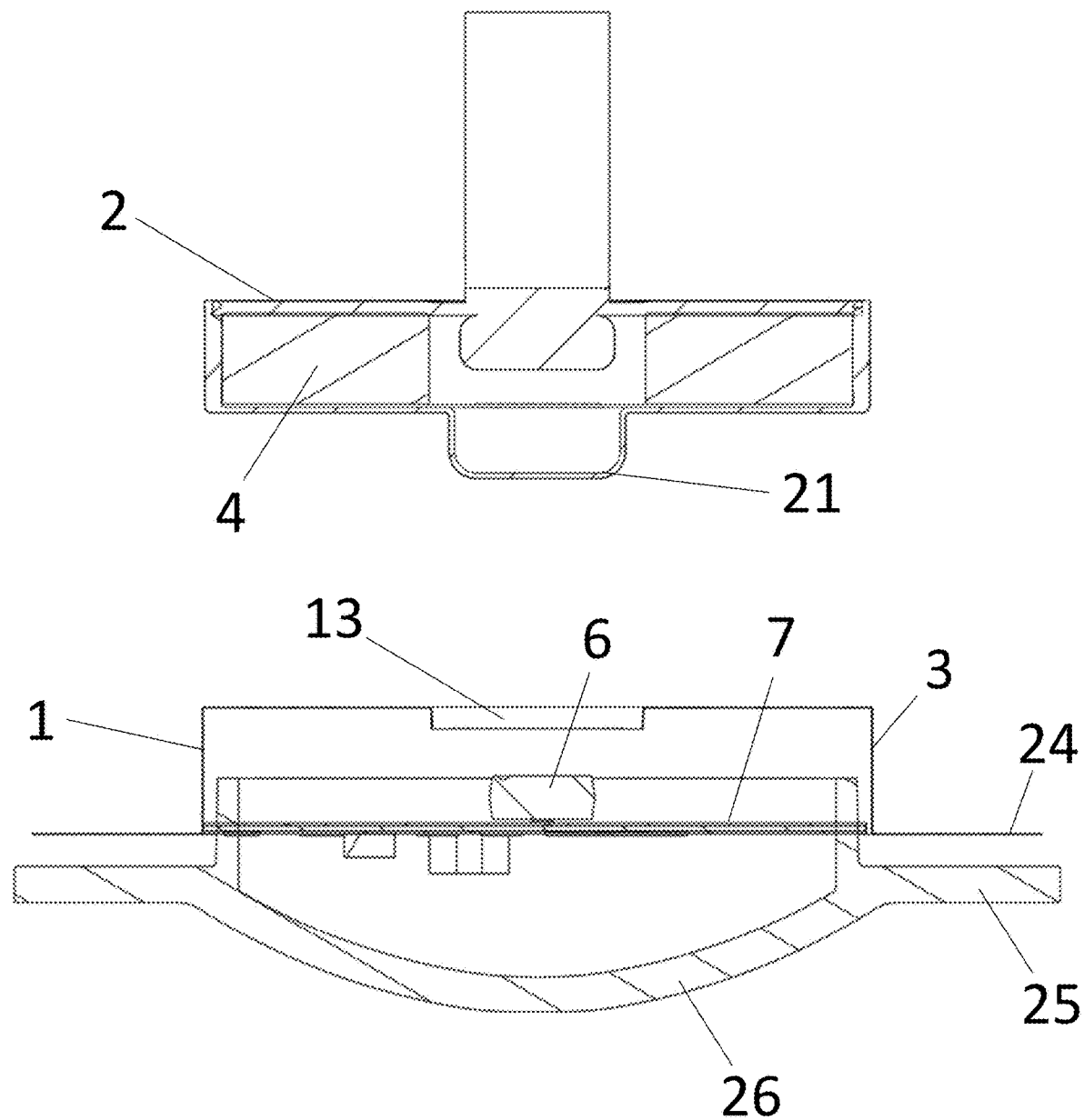
FIG. 16 shows a cross-sectional side view of a switch clasp with a female part comprising a magnetic sensor.

FIG. 16 shows an alternative switch clasp in accordance with another embodiment of the disclosure. The switch clasp comprises a male part 2 and a female part 1.

The female part 1 comprises a housing 3 and a cover 26. The housing 3 comprises a flange 24 and the cover 26 comprises a flange 25. As described in relation to other embodiments, the flanges 24 and 25 clamp a material/web therebetween. The female part 1 comprises a circuit board 7 housed between the cover 26 and the housing 3.

The female part 1 comprises a switch 6 proximate an aperture 13 formed in the housing 3. The switch 6 is a magnetic sensor, such as a reed switch or hall effect sensor.

The male part 2 comprises an annular magnet 4 proximate a projection 21. In use, the projection 21 of the male part 2 enters the aperture 13 of the female part 1 and the magnetic sensor 6 detects the presence of the magnet 4 to generate a signal, for example, to activate one or more output devices or to provide a signal to external circuitry. The housing 3 comprises, or is formed of, a magnetic material such that it is positively attracted to the annular magnet 4 when in proximity with the magnet 4.

Figure 17:
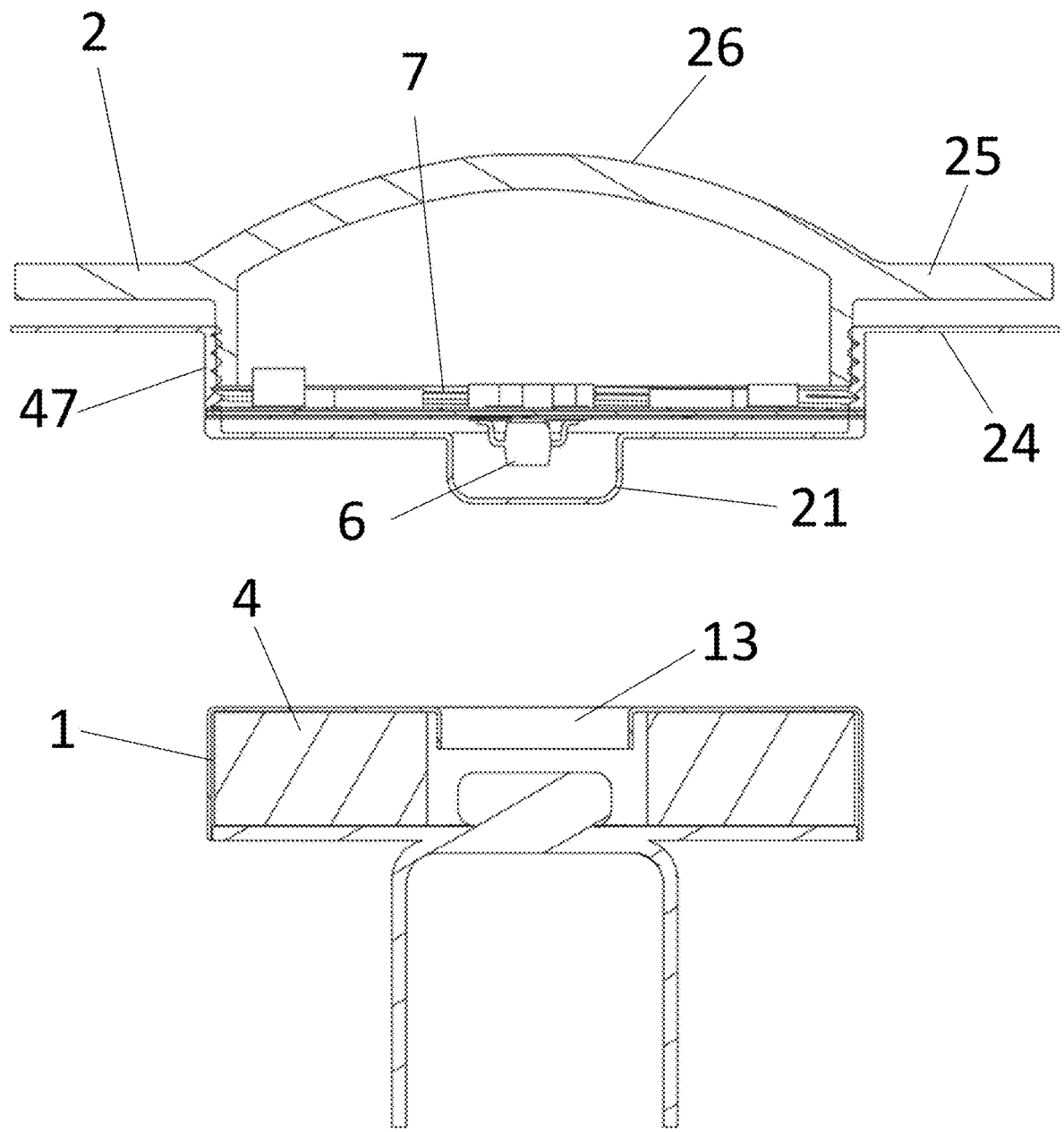
FIG. 17 shows a cross-sectional side view of a switch clasp with a male part comprising a magnetic sensor.

FIG. 17 shows an alternative switch clasp in accordance with another embodiment of the disclosure. The switch clasp comprises a male part 2 and a female part 1. The switch clasp of this embodiment differs from the previously described embodiments primarily in that the male part 2 comprises the switch 6. In this embodiment, the switch 6 is a magnetic sensor, such as reed switch or hall effect sensor.

The female part 1 comprises an annular magnet 4 surrounding a central aperture 13. The male part 2 comprises a housing 47 formed from, or comprising paramagnetic and/or ferromagnetic material, such that it experiences an attractive force when brought into proximity with the annular magnet 4 of the female part 1. The housing 47 of the male part 2 defines a projection 21 which is configured to fit within the aperture 13 of the female part 1. The male part 2 comprises a circuit board 7 fixed in position by the housing 47. The switch 6 is mounted centrally on the circuit board 7. The switch 6 is mounted on the circuit board 7 such that the switch 6 extends into the projection 21.

The male part 2 comprises a cover 26. The cover 26 comprises an externally threaded sleeve which engages with an internally threaded sleeve portion of the housing 47. A user can remove the cover 26 by rotating the cover 26 in order to access the circuit board 7 and any components mounted thereon. The cover 26 comprises a flange 25 and the housing 47 comprises a flange 24. The flanges 24, 25 are configured to clamp a material or web therebetween, as in the earlier embodiments.

As projection 21 of the male part 2 enters the aperture 13 of the female part 1, the magnetic sensor 6 detects the presence of the annular magnet 4 and generates a signal, for example, to activate one or more output devices or external circuitry. The housing 47 is formed from, or comprises, magnetic material, such that it experiences a positive magnetic attractive force when in the proximity of magnet 4. The magnetic attraction between the housing 47 and the magnet 4 provides the connection between the male part 2 and the female part 1.

Figure 18:
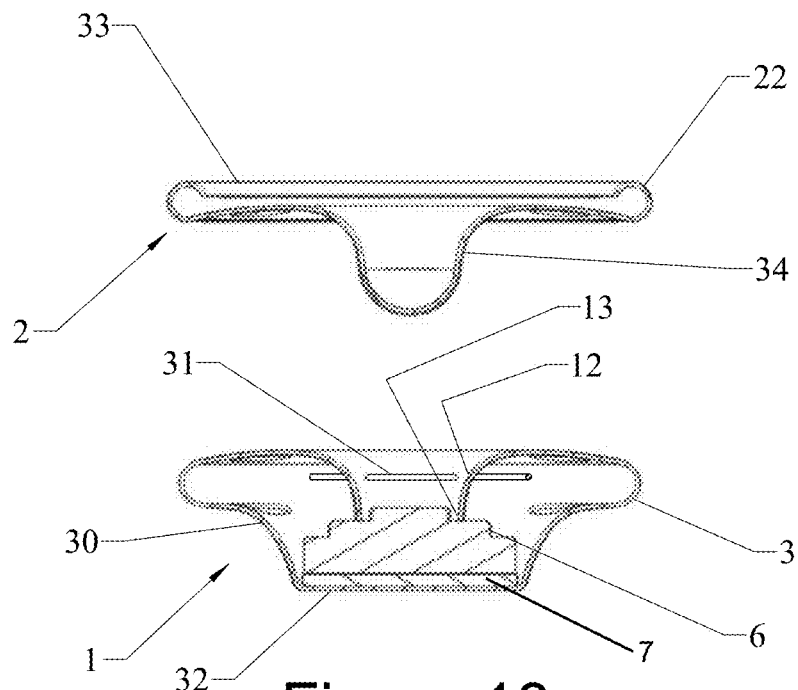
FIG. 18 shows a cross-sectional side view of a switch clasp comprising a snap pin and a push-button switch, with the first and second parts separated.

FIG. 18 shows a cross-sectional side view of a switch clasp in accordance with another embodiment. The embodiment of FIG. 18 comprises a female part 1 and a male part 2.

The female part 1 is formed from a generally annular housing 3 wherein an inner wall 12 descends progressively from a rim of the housing 3 to form an aperture 13. A resiliently deformable spring clip 31 is threaded through apertures formed in the inner wall 12. A side wall 30 of the housing 3 descends from the rim of the housing to form a chamber in which the microswitch 6 is housed such that the actuator of the microswitch 6 lies on the axis of the aperture 13. A housing base 32 extends from the side wall 30 so that the microswitch 6 is captured between the base 32 and the lower rim of the aperture (inner) wall 12.

In the embodiment of FIG. 18, the switch 6 is a pushbutton switch. In other embodiments, a lever switch can be used.

A circuit board 7 is disposed in the chamber between the microswitch 6 and the base 32. The circuit board 7 is in electrical contact with the microswitch 6. In some embodiments, the switch 6 is soldered to the circuit board 7. Although they are not shown in FIG. 18, the female part 1 comprises apertures to enable the connection of conductors to provide electrical communication between the circuit board 7 and external circuitry. In some embodiments, the apertures are formed in the base 32. In other embodiments, the apertures are formed in the side wall 30. The conductors are not shown in FIG. 18, but they are substantially identical to those shown in the embodiment of FIGS. 19 and 20, which are described in detail below. The conductors can be used to connect the switch 6 to external circuitry, as described in relation to other embodiments. The external circuitry may comprise a power supply, and/or one or more output devices.

The male part 2 comprises a disk 22 having a rim 33 formed by over folding a circular edge of the disc 22. The center of the disk 22 is plastically deformed into a pin 34 which is of similar external shape and diameter to the internal diameter of the aperture 13 of the female part 1. The pin 34 is formed with a waisted region of reduced diameter so that when the pin is pressed into the aperture 13 the waisted region cooperates with the spring clip 31 to capture the pin 34 and press the end of the pin 34 against the actuator (or lever) of the microswitch 6. The spring clip 31 holds the male part 2 within the female part 1. A user can apply a force to the male part 2 to elastically deform the clip 31 and enable release of the male part 2 from the female part 1.

Fastening structures are provided by apertures through each of the female part 1 and male part 2 whereby thread can be passed to secure the parts to respective opposable webs in use. Although the fastening structures are not shown in FIG. 18, they are identical to the fastening structures 106 shown in the embodiment of FIG. 20, which is described later in this specification.

Microswitch 6 is connected to external circuitry (not shown), preferably via the circuit board 7. When the male part 2 is pressed into the female part 1 to press the actuator (or lever) of the microswitch 6, one or more output devices of the external circuitry may be activated. For example, the external circuitry may comprise a light as an output device, and the male and female parts 2, 1 of the switch clasp may be secured to opposing sides or parts of a bag, or opposing sides of a garment.

Figure 19:
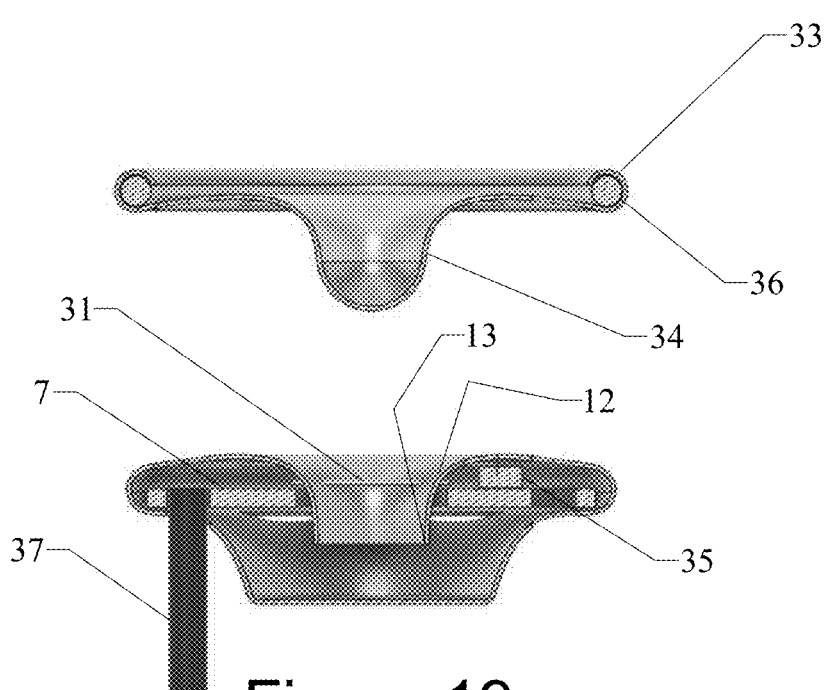
FIG. 19 shows a cross-sectional side view of a switch clasp comprising a snap pin and a magnetic sensor, with the first and second parts separated.
Figure 20:
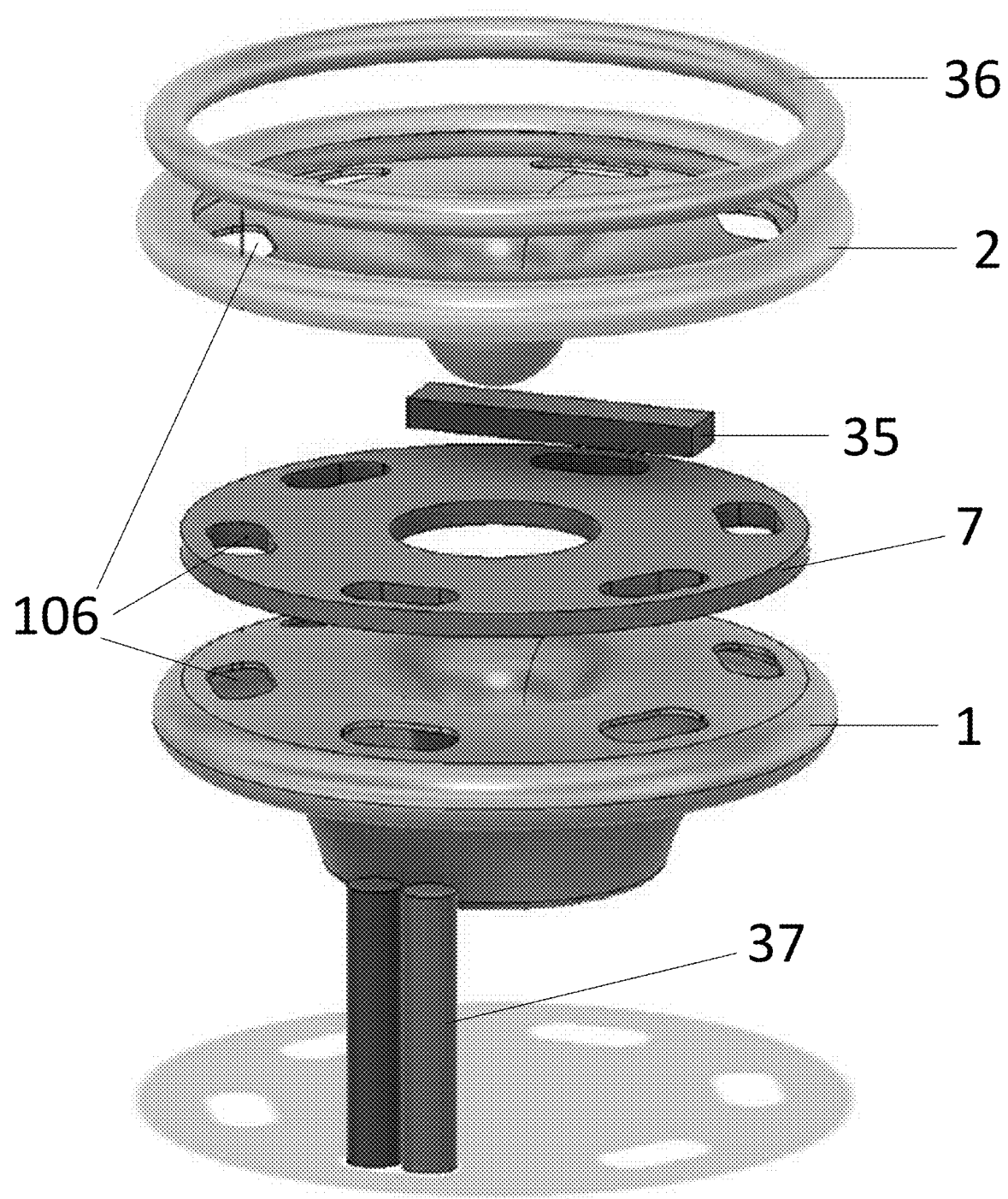
FIG. 20 shows an exploded perspective view of the switch clasp of FIG. 19.

FIG. 19 shows a cross-sectional side view of a switch clasp in accordance with another embodiment. FIG. 20 shows an exploded perspective view of the embodiment of FIG. 19.

The embodiment shown in FIGS. 19 and 20 is generally similar to the embodiment shown in FIG. 18 but removes the axially mounted microswitch 6 and substitutes a hall effect sensor 35 mounted on to the top side of the circuit board 7. The hall effect sensor is soldered to the circuit board 7. A round permanent magnet 36 is secured into the rim 33 whereby movement of the male part 2 into engagement with the female part 1 can be sensed by the hall effect sensor 35. Output from the circuit board 7 is via conductors 37. In a variant the Hall effect sensor 35 may be replaced by a reed switch. Conductors 37 provide an electrical connection between the hall effect sensor/reed switch and external circuitry, which may comprise output devices and/or a power source, as described in relation to other embodiments.

As shown in FIG. 20, the circuit board 7, as well as the male and female parts 2, 1, comprise fastening structures 106 as well as the male and female parts 2, 1. It is optional for the circuit board 7 to comprise fastening structures. In the embodiment of FIG. 18, the circuit board 7 does not comprise fastening structures 106.

For clarity, the components in FIG. 20 are not shown in the same order as they are assembled in FIG. 19. The circuit board 7 and hall effect sensor 35 are shown outside of the female part 1 in FIG. 20, but this is for clarity purposes only. When assembled, the circuit board 7 and the hall effect sensor 35 are inside the female part 1, as shown in FIG. 19.

In the embodiment of FIGS. 19 and 20, the circuit board 7 is not positioned against the base 32 when assembled. Instead, the circuit board 7 is positioned proximate the top (in the perspective of the Figures) of the female part 1. The circuit board 7 comprises a central aperture which is configured to allow the inner wall 12 of the female part 1 to pass therethrough. The side wall 30 provides a surface to support and maintain the position of the circuit board 7. These features ensure the circuit board 7, and the hall effect sensor 35, are near to the top of the female part 1, which in turn enables the hall effect sensor 35 to more easily detect the magnet 36 when the male part 1 enters the female part 2.

FIGS. 21-23 and 24(a) and (b) illustrate another embodiment of a switch clasp. In this embodiment, a sensor assembly is installed into the male part 2 instead of the female part 1.

The male part 2 comprises a housing 3 of generally rectangular shape which incorporates a circuit board 7 including a potentiometer 39. The potentiometer 39 is mounted on the circuit board 7. A coin cell 38 is mounted to the circuit board 7. The potentiometer 39 is coupled via a shaft 41 to a rotor 40. A back 107 of the housing 3 can be secured to a web by staples, stitching, or any other conventional means. The web is secured between the back 107 and the rest of the housing 3.

The female part 1 comprises a generally rectangular ring with a central through aperture 108 into which the housing 3 of the male part 2 can be received. The length, width and depth of the aperture 108 are substantially equal to the length, width and aperture of the housing 3 of the male part 2. Although the female part 1 is said to have a "rectangular" ring, in other embodiments, the female part 1 can have any shape, as long as the central aperture 108 is configured to receive the housing 3 of the male part 2. When the female part 1 is attached to an item (e.g., to a closure flap, side of a bag, or other item), a hole is cut in the item to align with the aperture 108. The female part 1 is then secured to the item using staples, stitching, or any other conventional means.

The female part 1 also comprises retaining portions 109. In other embodiments, the female part 1 does not comprise retaining portions. The retaining portions 109 are recesses formed along an inner edge of a top surface 112 of the ring. The retaining portions 109 are positioned centrally along the length of the ring. The retaining portions 109 extend downwards from the top surface 112 of the ring. The retaining portions 109 have a depth which is less than a height of the ring and, in the embodiment shown in FIG. 16, the retaining portions 109 have a depth equal to approximately one third of the height of the ring. The width of the retaining portions is substantially equal to the width of the rotor 40.

In use, the switch clasp is secured (i.e., the male and female parts 2, 1 are secured) by locating the housing 3 into the ring (i.e., positioning the housing 3 inside the aperture 108 such the entire depth of the housing 3 is within the aperture 108) and rotating the rotor 40 from an insertion condition shown in FIGS. 21 and 23, to a secured condition as shown in FIG. 22. In the insertion condition, the male part 2 is configured such that the rotor 40 is aligned parallel with the housing 3 (i.e., the length of the rotor is parallel with the length of the housing 3). In the secured condition, the male part 2 is configured such that the rotor 40 is aligned perpendicular with the housing 3 (i.e., the length of the rotor 40 is perpendicular with the length of the housing 3). When the male part 2 is positioned in the aperture 108 and the rotor 40 is rotated into the secured condition, an underside surface of the rotor 40 bears against the top surface 112 of the ring to attract the parts together. When a user releases the male and female parts 2, 1 after securing the clasp, the male part 2 partially exits the female part 1 (i.e., a fraction of the housing 3 exits the aperture 108, but the majority of the housing 3 is within the aperture 108) such that an underside of the rotor 40 abuts the top surface 110 of the retaining portions 109. Sidewalls 111 of the retaining portions 109 abut a side of the rotor 40 to prevent accidental rotation of the rotor 40. To release the connection between the male and female parts 2, 1, a user forces the housing 3 fully into the aperture 108 such that rotor 40 moves out of the retaining portions 109 and is free to rotate, and the user rotates the rotor 40 back into the insertion condition.

Rotation of the rotor 40 is sensed by the change in resistance of the potentiometer 39 and the engagement or disengagement condition determined by the current or voltage across the potentiometer and its correlation to the condition is output to output conductors 37. The potentiometer acts as a switch to control one or more output devices. Output conductors 37 may connect the circuitry within the male part 2 to external circuitry. As in other embodiments, the external circuitry may comprise one or more output devices and/or power supplies. In an example, the switch clasp is used to activate one or more output devices, for example to illuminate the inside of a bag/purse. In such examples, the male and female parts 2, 1 are connected to opposing sides of the bag. When the rotor 40 is in the insertion condition, the potentiometer may cause a light to illuminate. When the rotor 40 is rotated 90° into the secured condition, to securely connect the male and female parts 2, 1 together (as shown in FIG. 16), the potentiometer may cause the light to be turned off.

In other embodiments, a rotary switch may be used in place of a potentiometer.

In some embodiments, the male part 2 comprises a battery 38 mounted on the circuit board 7. In some embodiments, the male part 2 comprises output devices 101 in electrical communication with the circuit board 7. In some embodiments, conductors 37 may be omitted as the male part 2 comprises a self-contained circuit.

FIGS. 25(a) and (b) show exploded side and perspective views of a switch clasp in accordance with another embodiment. FIG. 26 shows a cross-sectional side view of the same embodiment. The embodiment is most similar to the embodiment of FIGS. 21-23 and 24(a) and (b), however the engagement or disengagement of the parts 1, 2 is sensed by a hall effect sensor 35 mounted on the circuit board 7 of the male part 2 to sense the presence or absence of a magnet 36 mounted into the female part 1. In other embodiments, the hall effect sensor 35 may be replaced with a reed switch.

The connection and locking between the male part 2 and the female part 1 is identical to in the embodiment of FIGS. 21-24. The male part 2 comprises a housing 3 and a rotor 40, and the female part 1 comprises a central aperture 108 configured to receive the housing 3, as described above.

In the embodiment of FIGS. 25(a) and (b) and 26, the female part 1 comprises magnets 36. In the embodiments shown, there are two magnets 36 disposed at opposing ends of the ring. In other embodiments, the female part 1 may comprise a single magnet, or any number of magnets.

The male part 2 comprises a hall effect sensor 35, or reed switch, instead of a potentiometer. In use, when a user disposes the housing 3 within the aperture 108, the hall effect sensor 35 detects the presence of the magnets 36. The hall effect sensor 35 sends/generates an electrical signal in response to detection of the magnets 36. In an example, the hall effect sensor 35 acts as a switch. In such an embodiment, the hall effect sensor 35 may act as an open circuit when the male and female parts 2, 1 are connected and act as a closed circuit when the male and female parts 2, 1 are separated, or vice versa. This can be used to cause an output device 110, such as a bulb or LED, to illuminate an area when the male and female parts 2, 1 are separated. Additionally or alternatively, the hall effect sensor 35 may generate and/or send a signal to an external circuit for further processing.

FIGS. 27(a) and (b) and FIG. 28 show an alternative embodiment of a switch clasp in accordance with an embodiment of the disclosure. The embodiment is substantially similar to the switch clasps of FIGS. 21-24 and of FIGS. 25-26. FIG. 27(b) shows a cross-section of the male part 2 of the embodiment of FIG. 27(a), such that the internal components can be seen.

The male part 2 comprises a rotor 40 which provides a locking mechanism together with an aperture 108 of the female part 1, as described in the earlier embodiments. The rotor 40 is connected to a rotating portion 45. The rotating portion 45 rotates together with the rotor 40. The male part 2 comprises a spring 47. The spring 47 is compressed between an upper side of the housing 3 and the rotating portion 45 such that the spring 47 exerts a force upon the rotating portion 45 to maintain an abutment between the rotating portion 45 and the printed circuit board 7.

As shown in FIG. 28, the rotating portion 45 comprises a conductive portion 46. The conductive portion 46 extends across the diameter of the rotating portion 45. In use, as the rotor 40 rotates between an insertion condition and a secured condition, the conductive portion 46 rotates relative to the PCB 7. Electrical connections or electrodes are positioned on the PCB 7. The positions of the electrical connections/electrodes are configured to enable a circuit to be in an "open" or "closed" state depending on the orientation of the conductive portion 46.

For example, when the rotor 40 is in the insertion condition, the conductive portion 46 may provide an electrical connection to complete a circuit (i.e., the electrical connections may contact the conductive portion 46) and provide power to one or more output devices. Rotating the rotor 40 into a secured configuration may break the circuit and remove the power supply to the one or more output devices. As such, the rotor 40 simultaneously acts as a locking mechanism and a switch.

FIG. 29 shows a cross-sectional side view of a switch latch/clasp in accordance with another embodiment of the disclosure. FIG. 30 shows a perspective view of the switch latch of FIG. 29, but with the male and female parts 2, 1 disengaged. The embodiment shown in FIGS. 29 and 30 shows a latch in which the male part 2 is in the form of a wedge which is pressed into a female part 1, deforming a wedging surface 41 by engagement with a hoop 42. The stress imposed by the deformation attracts the male part 2 to the female part 1.

The male part 2 incorporates a magnet 36. The male part 2 comprises a base in which the magnet is housed. The male part 2 comprises a wedge portion extending from the base. The wedge portion comprises an elastically deformable wedging surface 41. The wedging surface 41 is sloped such that the height of the wedge portion decreases as it extends away from the base.

The female part 1 has a base housing a circuit board 7. The circuit board 7 supports a coin cell 38 and a Hall effect sensor 35 whereby the circuit electronics of the circuit board 7 is responsive to the proximity of male part 2 in the engagement condition or its absence in the disengagement condition. The female 1 part comprises a hoop 42 extending from the base.

In use, the male part 2 is urged toward the female part 1 by a user such that the wedge portion passes through the hoop 42. As the wedging surface 41 is brought into contact with the hoop 42, it deforms to enable the wedging portion to pass further through the hoop 42. The abutment between the hoop 42 and the deformed wedging surface 41 provides friction to prevent the male part 2 sliding out of the female part 1 without external force being provided by a user.

In the embodiment of FIGS. 29 and 30, the female part 1 also houses output devices 101. In the embodiment shown, there are three output devices 101, but in other embodiments there may be one output device 101, or any plurality of output devices 101. As with other embodiments, the output devices may be LEDs, Bulbs, Buzzers, etc. The output devices are mounted onto the circuit board 7, on the opposite side to the coin cell 38 and the hall effect sensor 35.

When the male part 2 is fixed (via the hoop 42) inside the female part 1, the magnet 36 is sufficiently close to the hall effect sensor 35 to cause the hall effect sensor 35 to send/generate a signal. As in the other embodiments, the hall effect sensor 35 can act as a switch, for example to control the one or more output devices 101. In some embodiments, the hall effect sensor 35 may be replaced by any other type of switch capable of detecting the presence of the magnet 36, for example, a reed switch.

In some embodiments, the coin cell 38 and/or the output devices 101 are omitted from the female part 1. In such embodiments, the coin cell and/or the output devices may form part of external circuitry. In such embodiments, the circuit board 7 and the switch 6 are connected to the external circuitry via conductors 37, as in other embodiments described herein.

FIGS. 31 and 32 show cross-sectional side views of a switch latch/clasp in accordance with another embodiment. The switch clasp of FIGS. 31 and 32 is substantially similar to the switch clasp of FIGS. 29 and 30, but it comprises a switch 6 instead of a hall effect sensor. The embodiment shown in FIG. 31 has a hollow male part 2 providing a chamber 43 in which a microswitch 6 with a lever actuator is mounted onto a circuit board 7.

In the disengagement condition (shown in FIG. 31) the microswitch 6 is pressed against the inside chamber surface underlying the wedging surface 41 (i.e., the lever of the switch 6 rests against the wedging surface 41). When the male part 2 is wedged into the female part 1, as shown in FIG. 32, the hoop 42 deforms the wedging surface 41 and displaces the tip of the microswitch lever. The circuit board 7 is responsive to the microswitch 6 to indicate the engagement and disengagement conditions. Displacing the lever of the microswitch 6 changes the switch condition. As in other embodiments described herein, the switch 6 can be used to turn one or more output devices on or off. As in the other embodiments, the output devices may be integral with the male or female parts 2, 1, or may be part of an external circuit.

FIG. 33 shows a side view of a switch clasp in accordance with another embodiment of the disclosure. The switch clasp comprises a male part 2 and a female part 1. The circuitry within the male and female parts 2, 1 can be identical to the circuitry within the switch clasps of FIGS. 29-30 or FIGS. 31-32.

The wedging surface 41 of the male part 2 comprises a lip 44. As the male part 2 is pushed into the female part 1, the hoop 42 deforms the wedging surface 41 such that the male part 2 can extend into the female part 1 and the lip 44 can pass through the hoop 42. Once the lip 44 has passed through the hoop 42, the wedging surface 41 elastically returns to its original shape (i.e., the deformation is reversed). The lip 44 forms a surface which abuts a side of the hoop 42 in order to prevent the male part 2 exiting the female part 1.

Figure 34:
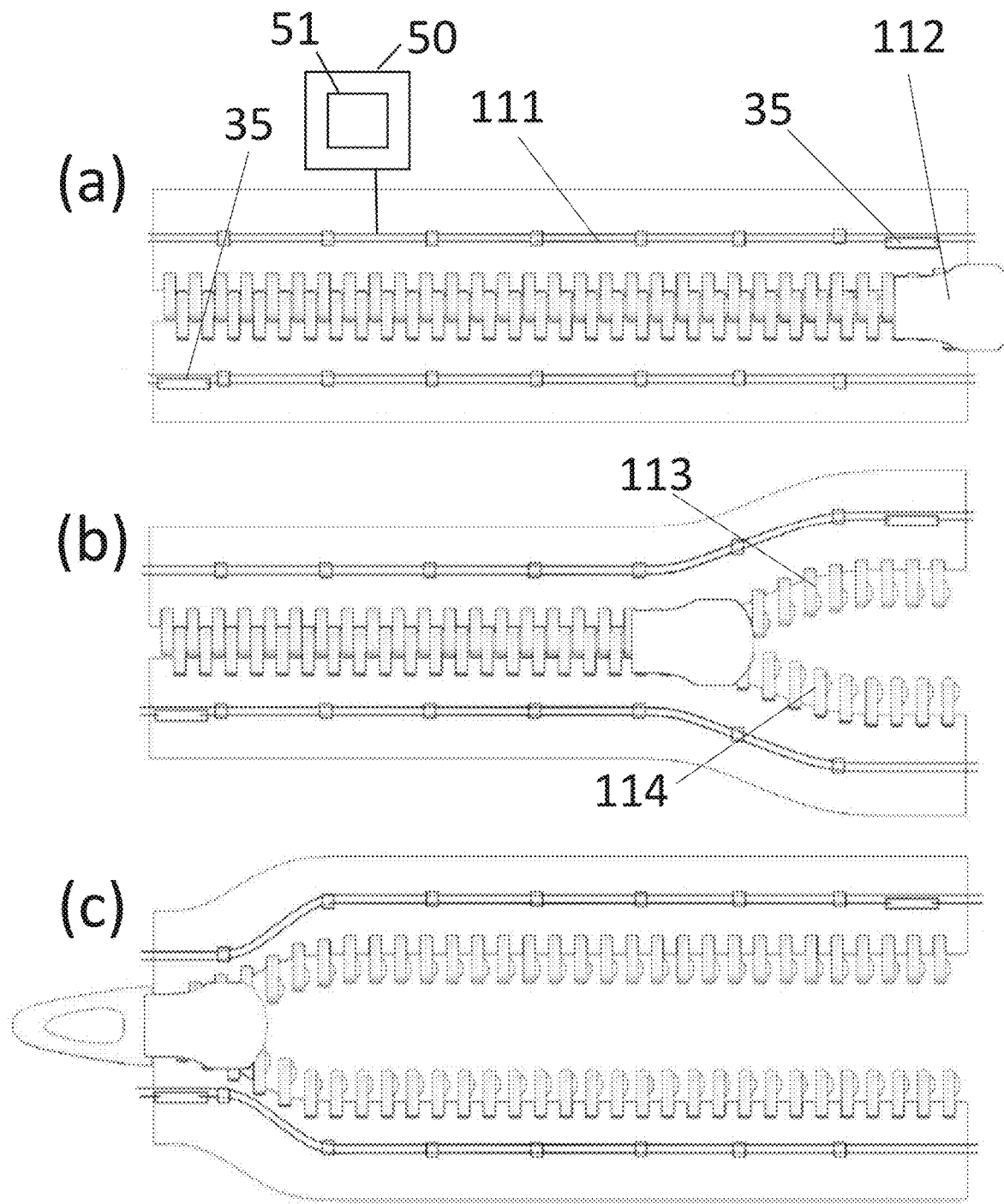

FIGS. 34(a-c) show a zip clasp in accordance with another embodiment of the disclosure. The Figures show the underside of a zip as it moves from a closed configuration in FIG. 34(a), through an intermediate configuration in FIG. 34(b), to an open configuration in FIG. 34(c). The zip comprises a pull tab 112 which is configured to connect two sets of teeth 113, 114, as in a conventional zip. The two sets of teeth 113, 114 can be attached to fabric 116 of an item, such as a bag, in a similar manner to a conventional zip (e.g., via stitching).

Conductive tracks 111 are positioned adjacent to the sets of teeth 113, 114 and run parallel with the sets of teeth 113, 114. The conductive tracks 111 are formed from, or comprise, a flexible conductive material. In some embodiments, the conductive tracks 111 are formed from, or comprise, conductive ink, conductive thread, or any other conductive flexible material. In some embodiments, the conductive tracks 111 adjacent the first set of teeth 113 are separated from the conductive tracks 111 adjacent the second set of teeth 114, such that the conductive tracks 111 form two distinct circuits. In some embodiments, the conductive tracks 111 form a single set of conductive tracks (i.e., the conductive tracks 111 adjacent each set of teeth 113, 114 are connected and joined to form a continuous conductive track).

A hall effect sensor 35 is connected to the conductive tracks 111. The conductive tracks 111 are also connected to external circuitry 50 comprising one or more output devices 51 and a power supply, such as a battery.

The pull tab 112 comprises, or is, a magnet (i.e., the pull tab 112 is formed from or comprises magnetic material). As the zip is closed (or opened), the pull tab 112 passes proximate to the hall effect sensor 35 which generates an output signal. The output signal is used to control one or more output devices, such that the zip is configured to act as a switch. For example, the zip may be used to turn on a light as a zip is opened and to turn off the light when the zip is closed.

In the embodiment of FIG. 34, there are two hall effect sensors 35. In such embodiments, one hall effect sensor 35 may be used to detect that the zip is in a closed configuration and the other hall effect sensor 35 may be used to detect that the zip is in an open configuration. In other embodiments, the zip clasp may comprise one hall effect sensor, or any plurality of hall effect sensors. In some embodiments, the one or more hall effect sensors 35 may be replaced by any component/circuitry suitable for detecting the presence of a magnet, such as reed switches.

Figure 35:
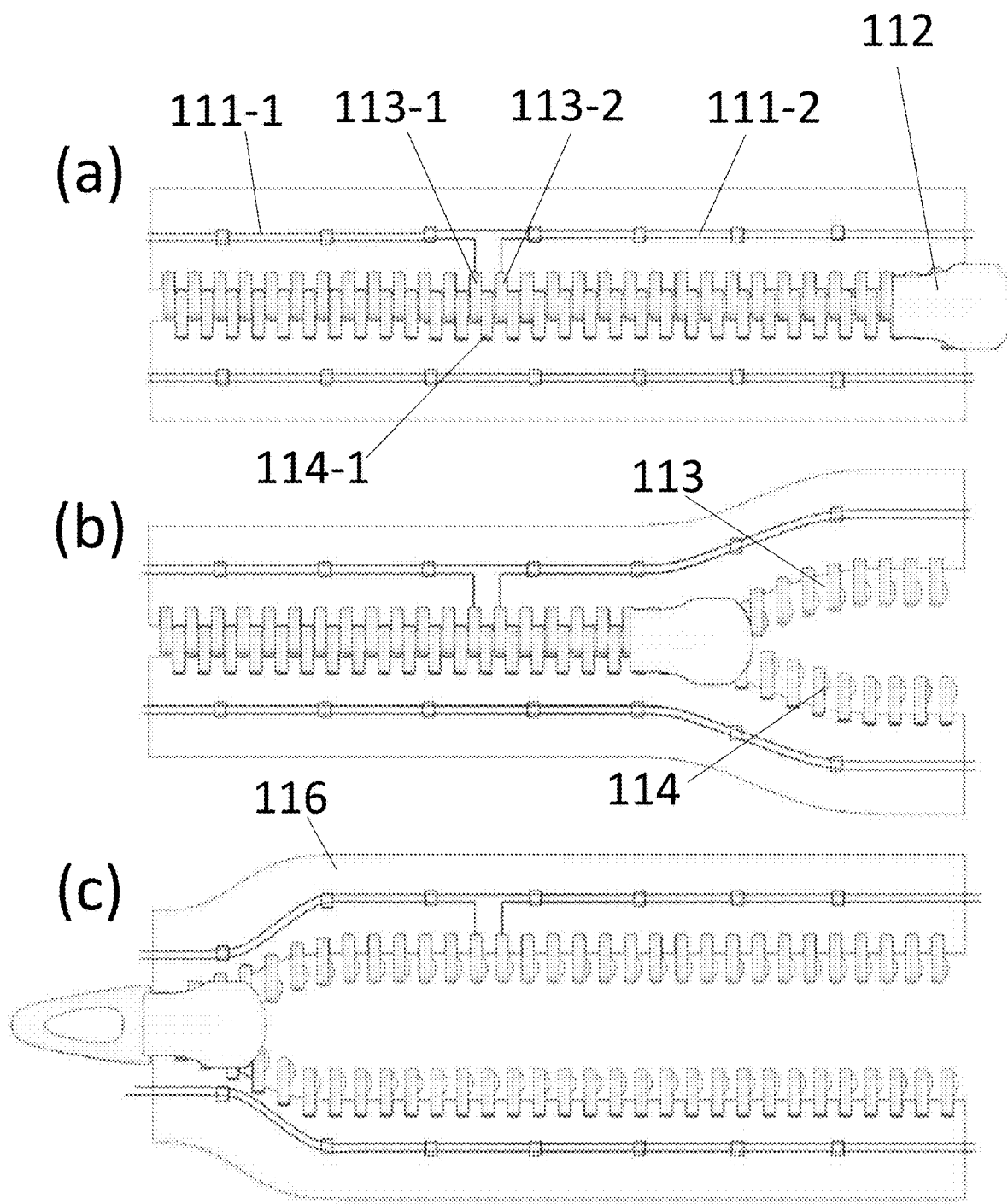

FIGS. 35(*a-c*) show a zip clasp in accordance with another embodiment of the disclosure. The zip clasp in the embodiment of FIG. 35 is substantially similar to the zip clasp in the embodiment of FIG. 34. FIGS. 35(*a*)-(*c*) show the underside of a zip as it moves from a closed configuration in FIG. 35(*a*), through an intermediate configuration in FIG. 35(*b*), to an open configuration in FIG. 35(*c*). The zip comprises a pull tab 112 which is configured to connect two sets of teeth 113, 114, as in a conventional zip.

The two sets of teeth 113, 114 can be connected to an item, such as a bag, in a similar manner to a conventional zip. Conductive tracks 111 are positioned adjacent to the sets of teeth 113, 114 and run parallel with the sets of teeth 113, 114. The conductive tracks 111 are formed from, or comprise, a flexible conductive material. The two sets of teeth 113, 114 are also formed from, or comprise, a conductive material. Alternatively, the majority of teeth can be made from, or comprise non-conductive material, and only the teeth described below in relation to operating of switch are made from, or comprise, conductive material.

The conductive tracks 111 are split into two sections 111-1, 111-2. The sections 111-1, 111-2 of the conductive tracks 111 are connected to a pair of neighboring teeth 113-1, 113-2 in the first set 113 of teeth. The first section 111-1 of the conductive tracks 111 is connected to tooth 113-1. The second section 111-2 of the conductive tracks 111 is connected to tooth 113-2. When the zip is an open configuration, as shown in FIG. 35(*c*), tooth 113-1 and tooth 113-2 are not in electrical contact with each other. The conductive tracks 111 form an open circuit when the zip is in the open configuration.

As the zip's pull tab 112 connects the two sets of teeth 113, 114, tooth 114-1 is disposed between teeth 113-1 and 113-2. Tooth 114-1 is made of, or comprises, an electrically conductive material, so it provides an electrical connection between teeth 113-1 and 113-2. Electrically connecting teeth 113-1 and 113-2 electrically connects the first and second sections 111-1, 111-2 of the conductive tracks 111. The connection between the two conductive track sections 111-1, 111-2 may be used to activate or deactivate an output device, such that the zip is able to act as a switch.

In some embodiments, the conductive tracks 111 form part of a circuit which activates an output device (e.g., illuminates a bulb/LED) or generates a signal for further signal processing by external circuitry. In such embodiments, closing the zip (and therefore electrically connecting the two conductive track sections 111-1, 111-2) completes a circuit to provide power to an output device. By contrast, opening the zip and breaking the connection between the conductive track sections 111-1, 111-2 stops the supply of power to an output device. In other embodiments, the opposite may be true, and breaking the electrical connection between teeth 113-1 and 113-2 (by opening the zip) may activate an output device (e.g., illuminate a bulb/LED).

In some embodiments, the conductive tracks 111 are split into more than two sections. In such embodiments, each section is connected to conductive zip teeth so as to form a switch in a similar manner to teeth 113-1, 113-2, and 114-1 above. The use of additional switches in such embodiments can be used to control additional output devices.

Figure 36:
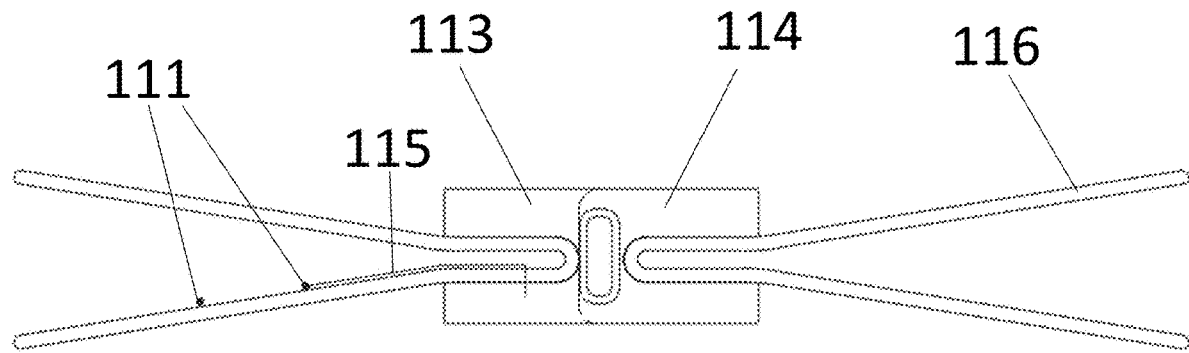
Figure 36:
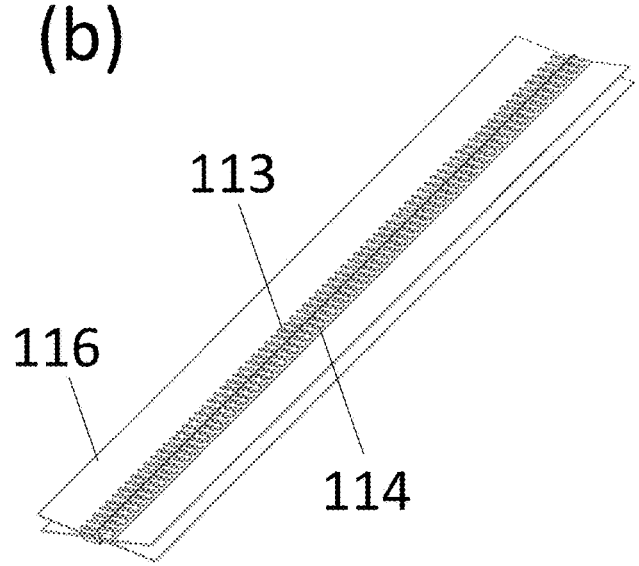

In the embodiments of FIG. 34 or 35, the conductive tracks 111 may be protected by the fabric 116 to which the sets of teeth 113, 114 are connected. As shown in FIGS. 36(*a*) and 36(*b*), the fabric 116 is folded, and the fold is connected to the teeth 113, 114. Conductive tracks 111 can be disposed on a surface of the fabric 116 which is within the fold, as shown in FIG. 36(*a*). FIG. 36(*a*) also shows a connection 115 between one of the teeth 113 and the conductive tracks 111. Folding the fabric 116 before connection to the teeth 113, 114 may help to protect components, such as conductive tracks, from the zip's pull tab.

In some embodiments, output devices and/or connections to external circuitry may be disposed between the folded sides of the fabric 116. The fabric 116 may comprise one or more holes through which output devices can provide an output. The folded fabric 116 may also cover and protect a PCB and/or any other component.

From reading the present disclosure, other variations and modifications will be apparent to the skilled person. Such variations and modifications may involve equivalent and other features which are already known in the art of garments incorporating electronic capabilities, and which may be used instead of, or in addition to, features already described herein.

Although the appended claims are directed to particular combinations of features, it should be understood that the scope of the disclosure of the present disclosure also includes any novel feature or any novel combination of features disclosed herein either explicitly or implicitly or any generalization thereof, whether or not it relates to the same disclosure as presently claimed in any claim and whether or not it mitigates any or all of the same technical problems as does the present disclosure.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness, it is also stated that the term "comprising" does not exclude other elements or steps, the term "a" or "an" does not exclude a plurality, a single processor or other unit may fulfil the functions of several means recited in the claims and any reference signs in the claims shall not be construed as limiting the scope of the claims.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A switch clasp comprising:
   a first part having a fastening structure adapted to secure the first part to a first item;
   a second part having a fastening structure adapted to secure the second part to a second item; said second part having a set of zip teeth adapted to engage with a complementary set of zip teeth of the first part;
   at least one of said first part and second part including a sensor responsive to engagement and disengagement of the first and second parts to switch from a first condition to a second condition whereby a signal corresponding to the condition is output; and
   a zip pull tab configured to connect the set of zip teeth to the complementary set of zip teeth,
   wherein:
   the sensor includes a first section of conductive track connected to a first conductive tooth of the set of zip teeth and a second section of conductive track connected to a second conductive tooth of the complementary set of zip teeth; and
   the zip pull is configured to connect the first conductive tooth to the second conductive tooth to electrically connect the first section of conductive track to the second section of conductive track when connecting the set of zip teeth to the complementary set of zip teeth.

2. A switch clasp according to claim 1, wherein the sensor includes a Hall effect sensor mounted in one part to sense the proximity of a magnet mounted in the other part.

3. A switch clasp according to claim 1, wherein the clasp further comprises one or more output devices.

4. The switch clasp according to claim 1, further comprising an output device, wherein the electrical connection between the first section of conductive track to the second section of conductive track activates or deactivates the output device.

5. The switch clasp according to claim 1, wherein the first section of conductive track is encased within a first folded portion of fabric connected to the set of zip teeth and the second section of conductive track is encased within a second folded portion of fabric connected to the complementary set of teeth.

6. A switch clasp comprising:
   a first part having a first fastening structure adapted to secure the first part to a first item;
   a second part having a second fastening structure adapted to secure the second part to a second item, the second part having a set of zip teeth and the first part having a complementary set of zip teeth that engage with the set of zip teeth;
   a zipper having the complementary set of zip teeth attached to the first part, the set of zip teeth attached to the second part, and a zip pull tab including a magnet and being configured to connect the complementary set of zip teeth to the set of zip teeth to close the zipper when the zip pull tab is moved from a first end of the zipper to a second end of the zipper and configured to disconnect the complementary set of zip teeth to the set of zip teeth to open the zipper when the zip pull tab is moved from the second end of the zipper to the first end of the zipper; and
   at least one sensor attached to at least one of the first item and the second item and located proximate to the first end or the second end;
   wherein the at least one sensor generates at least one output signal in response to the magnet of the zip pull tab passing proximate to the at least one sensor.

7. The switch clasp of claim 6, wherein the at least one sensor includes a hall effect sensor.

8. The switch clasp of claim 6, wherein the at least one sensor includes a hall effect sensor located proximate to the first end and the at least one output signal generated by the hall effect sensor indicates that the zipper is open.

9. The switch clasp of claim 6, wherein the at least one sensor includes a hall effect sensor located proximate to the second end and the at least one output signal generated by the hall effect sensor indicates that the zipper is closed.

10. The switch clasp of claim 6, wherein:
   the at least one sensor includes a first hall effect sensor located proximate to the first end and a second hall effect sensor located proximate to the second end;
   the at least one output signal generated by the first hall effect sensor indicates that the zipper is open;
   the at least one output signal generated by the second hall effect sensor indicates that the zipper is closed.

* * * * *